(12) United States Patent
Seong et al.

(10) Patent No.: US 10,784,409 B2
(45) Date of Patent: Sep. 22, 2020

(54) SEMICONDUCTOR ELEMENT

(71) Applicant: LG INNOTEK CO., LTD., Seoul (KR)

(72) Inventors: Jun Seok Seong, Seoul (KR); Byeong Kyun Choi, Seoul (KR); Ku Hyun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/348,601

(22) PCT Filed: Nov. 10, 2017

(86) PCT No.: PCT/KR2017/012751
§ 371 (c)(1),
(2) Date: May 9, 2019

(87) PCT Pub. No.: WO2018/088851
PCT Pub. Date: May 17, 2018

(65) Prior Publication Data
US 2020/0066938 A1 Feb. 27, 2020

(30) Foreign Application Priority Data

Nov. 10, 2016 (KR) .................. 10-2016-0149373

(51) Int. Cl.
*H01L 33/40* (2010.01)
*H01L 33/00* (2010.01)
(Continued)

(52) U.S. Cl.
CPC .......... *H01L 33/405* (2013.01); *H01L 33/007* (2013.01); *H01L 33/0093* (2020.05);
(Continued)

(58) Field of Classification Search
CPC ...... H01L 27/156; H01L 27/153; H01L 33/38
See application file for complete search history.

(56) References Cited

U.S. PATENT DOCUMENTS

2011/0254040 A1  10/2011  Nagai
2012/0074441 A1  3/2012  Seo et al.
(Continued)

FOREIGN PATENT DOCUMENTS

JP          2015-103590       6/2015
KR     10-2012-0036927        4/2012
(Continued)

OTHER PUBLICATIONS

International Search Report dated Feb. 12, 2018 issued in Application No. PCT/KR2017/012751.
(Continued)

*Primary Examiner* — Selim U Ahmed
*Assistant Examiner* — Evan G Clinton
(74) *Attorney, Agent, or Firm* — KED & Associates LLP

(57) ABSTRACT

An embodiment provides a semiconductor element, which comprises: a plurality of semiconductor structures, each of which comprises a first conductive semiconductor layer, a second conductive semiconductor layer, an active layer disposed between the first conductive semiconductor layer and the second conductive semiconductor layer, and a first recess extending through the second conductive semiconductor layer and the active layer to a partial area of the first conductive semiconductor layer; a second recess disposed between the plurality of semiconductor structures; a first electrode disposed at the first recess and electrically connected to the first conductive semiconductor layer; a reflective layer disposed under the second conductive semiconductor layer; and a protrusion part disposed on the second recess and protruding higher than the upper surfaces of the semiconductor structures, wherein a surface, on which the first electrode contacts the first conductive semiconductor layer in the first recess, is 300 to 500 nm distant from the upper surfaces of the semiconductor structures.

18 Claims, 12 Drawing Sheets

(51) Int. Cl.
  *H01L 33/24* (2010.01)
  *H01L 33/44* (2010.01)
  *H01L 33/62* (2010.01)

(52) U.S. Cl.
  CPC .............. *H01L 33/24* (2013.01); *H01L 33/44* (2013.01); *H01L 33/62* (2013.01); *H01L 2933/0016* (2013.01); *H01L 2933/0025* (2013.01); *H01L 2933/0066* (2013.01)

(56) References Cited

U.S. PATENT DOCUMENTS

| | | |
|---|---|---|
| 2014/0110730 A1 | 4/2014 | Lee et al. |
| 2014/0219304 A1 | 8/2014 | Lee et al. |
| 2016/0093769 A1 | 3/2016 | Vom Dorp et al. |
| 2017/0154921 A1* | 6/2017 | Kim ........................ H01L 33/38 |
| 2017/0236979 A1 | 8/2017 | Seo et al. |
| 2017/0294479 A1* | 10/2017 | Cha ..................... H01L 33/0012 |
| 2017/0317236 A1 | 11/2017 | Lee et al. |

FOREIGN PATENT DOCUMENTS

| | | |
|---|---|---|
| KR | 10-2014-0099379 | 8/2014 |
| KR | 10-2015-0144048 | 12/2015 |
| KR | 10-2016-0093789 | 8/2016 |

OTHER PUBLICATIONS

Extended European Search Report dated May 4, 2020 issued in Application 17869479.0.

\* cited by examiner

[FIG. 1]
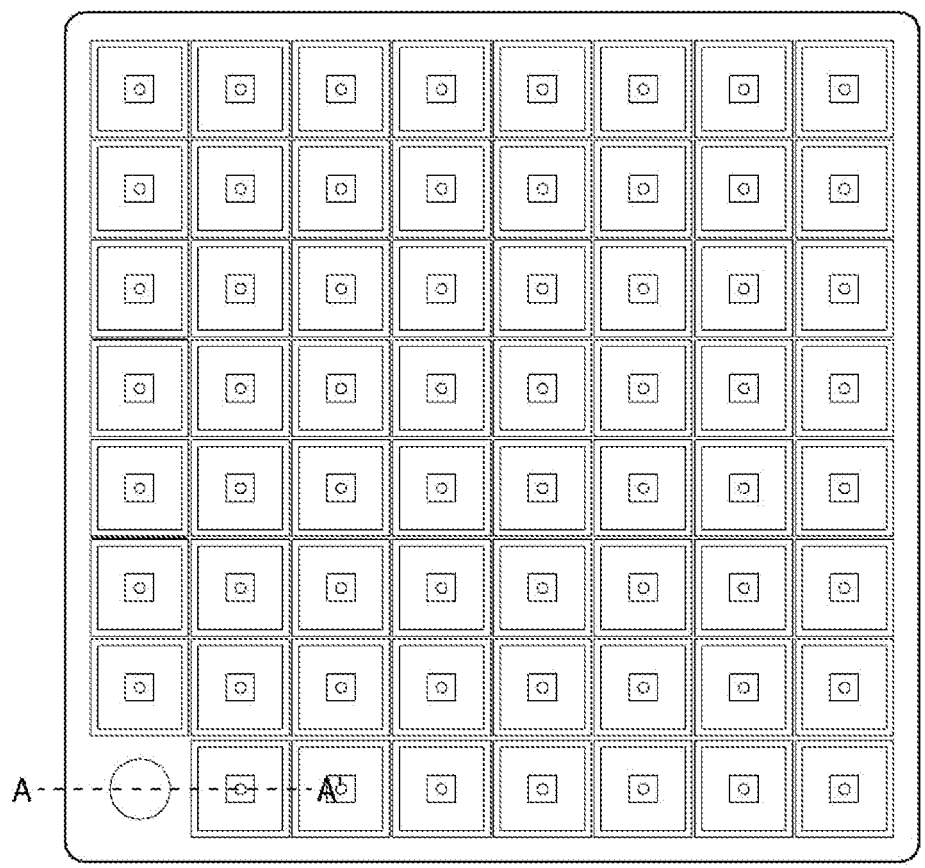

[FIG. 2]
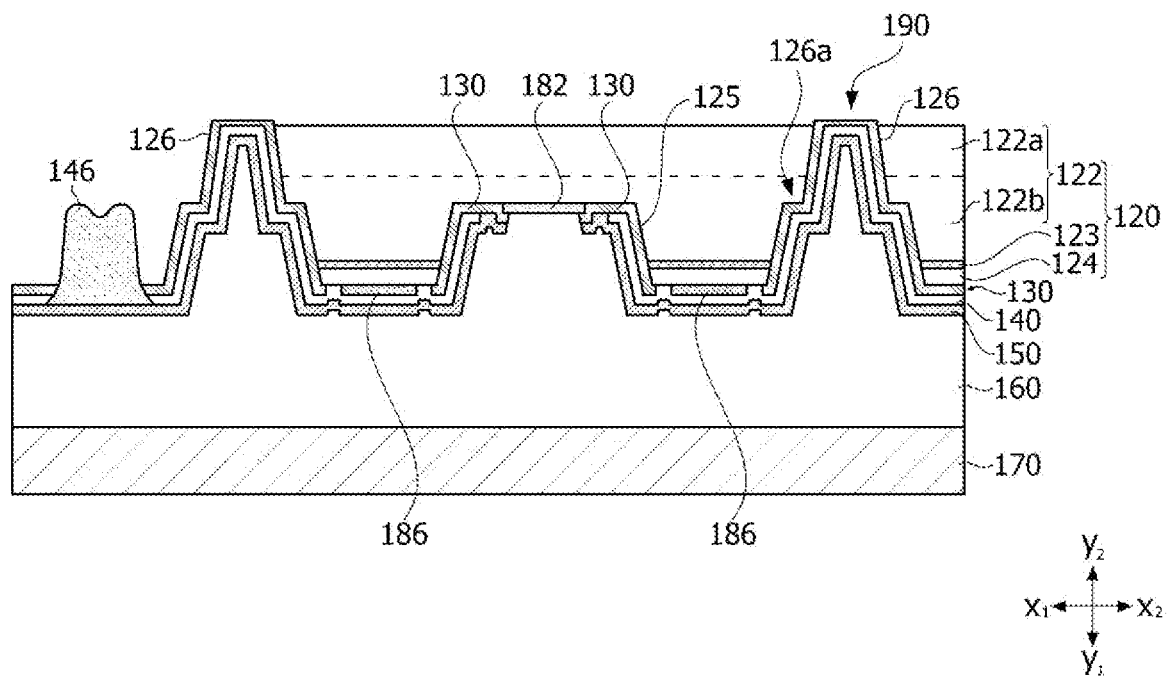
[FIG. 3]
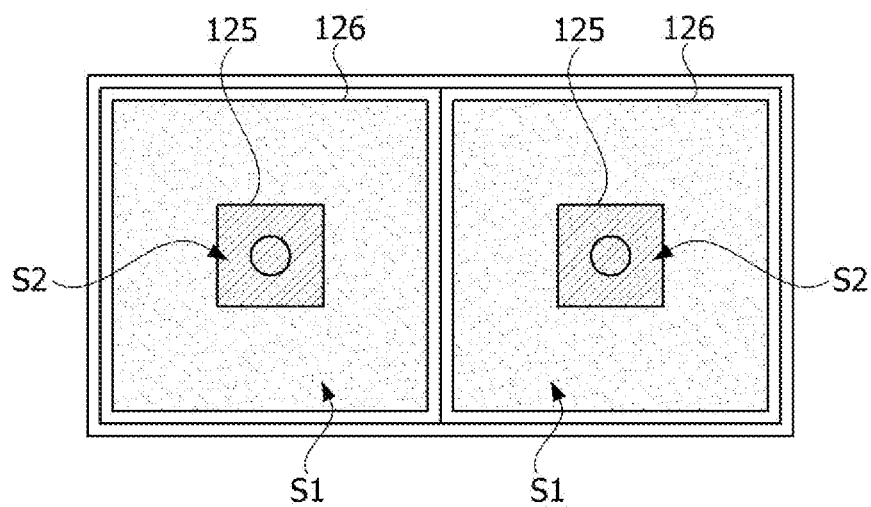

[FIG. 4A]
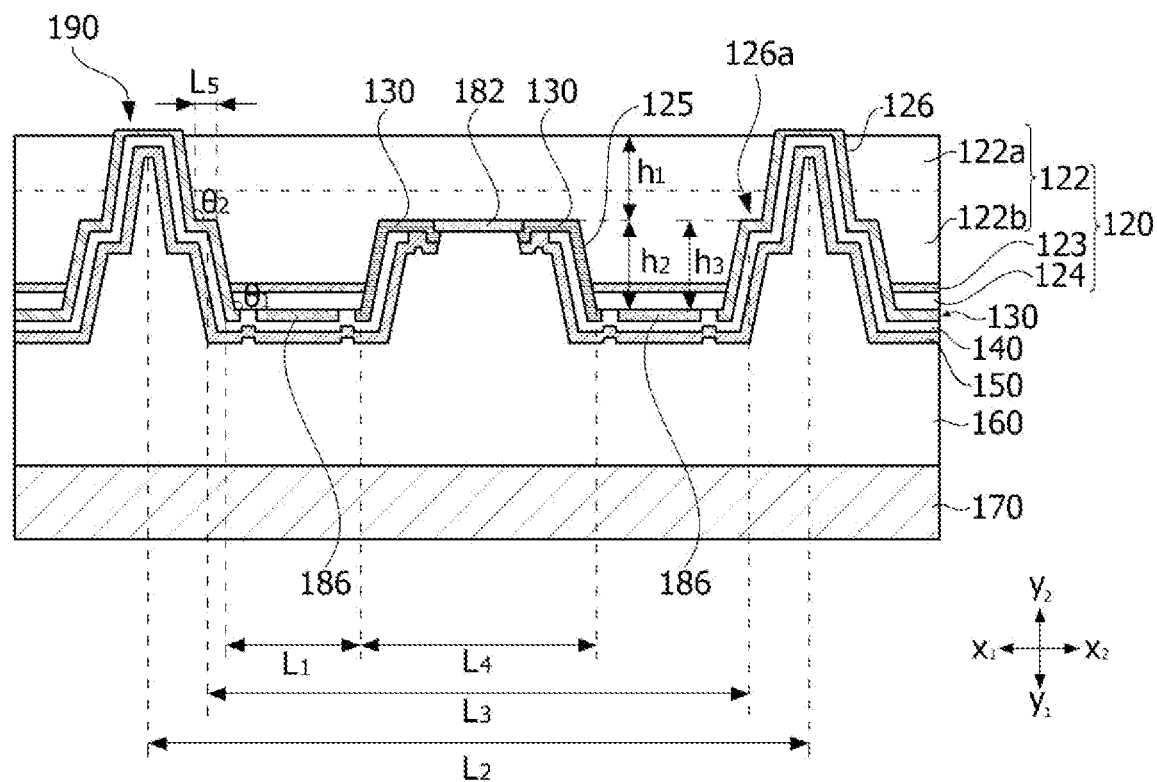
[FIG. 4B]
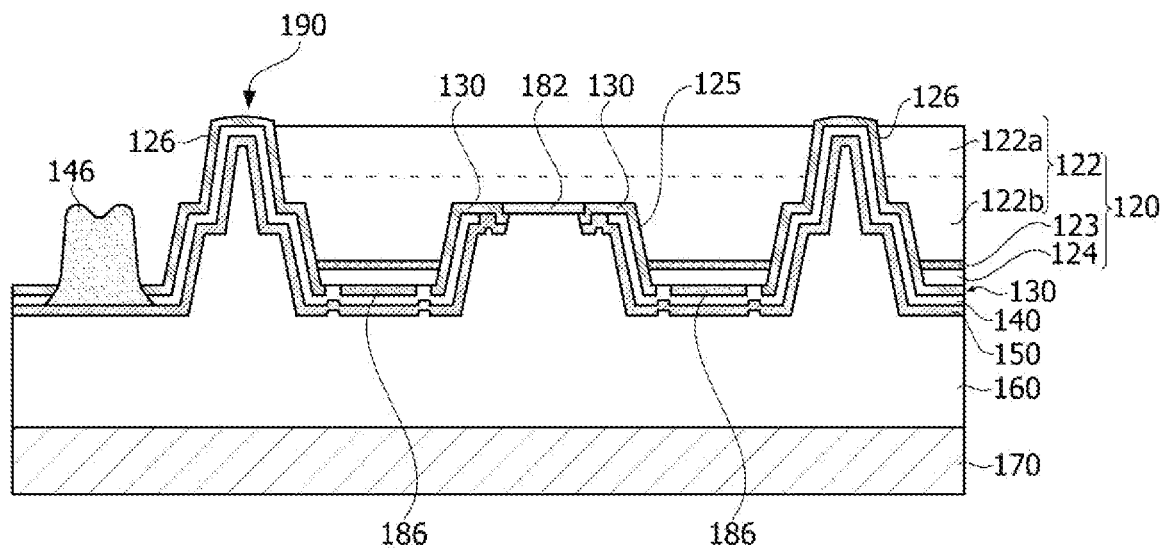

[FIG. 4C]
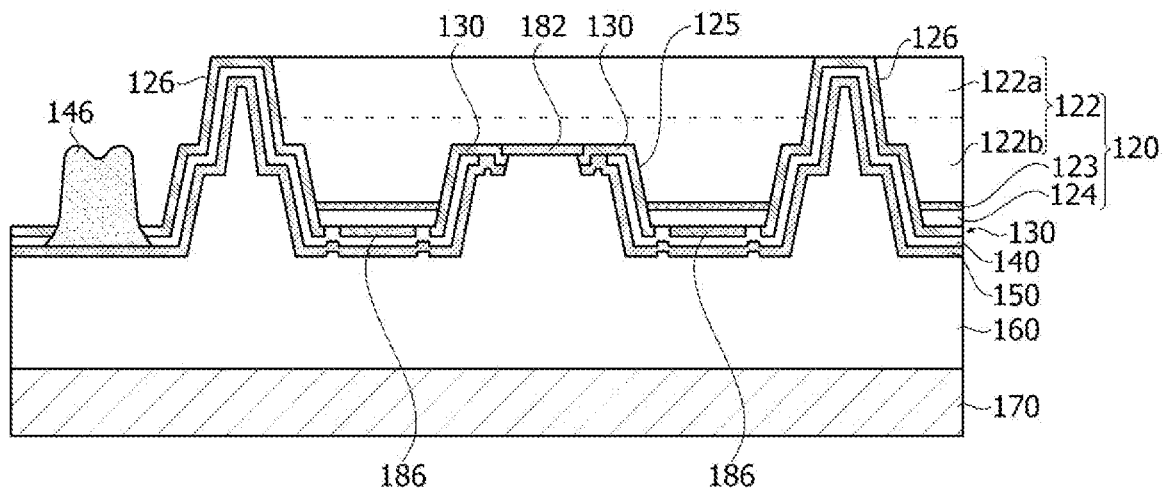
[FIG. 4D]
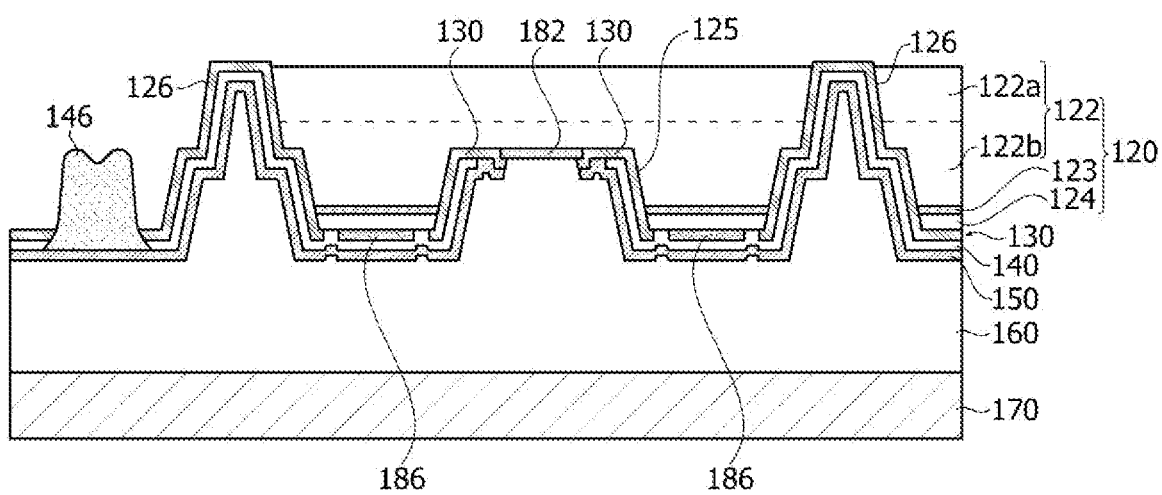

[FIG. 4E]
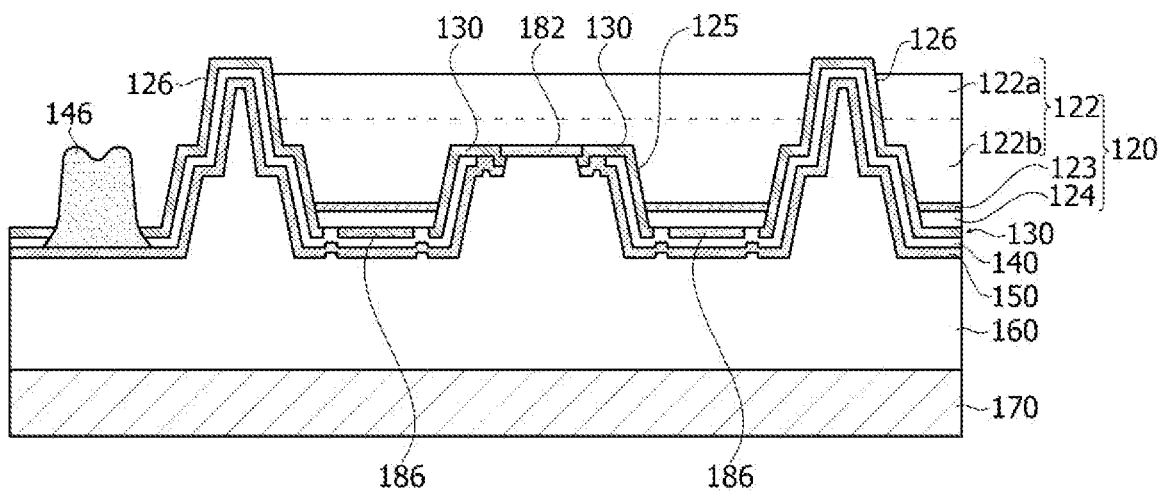
[FIG. 5]
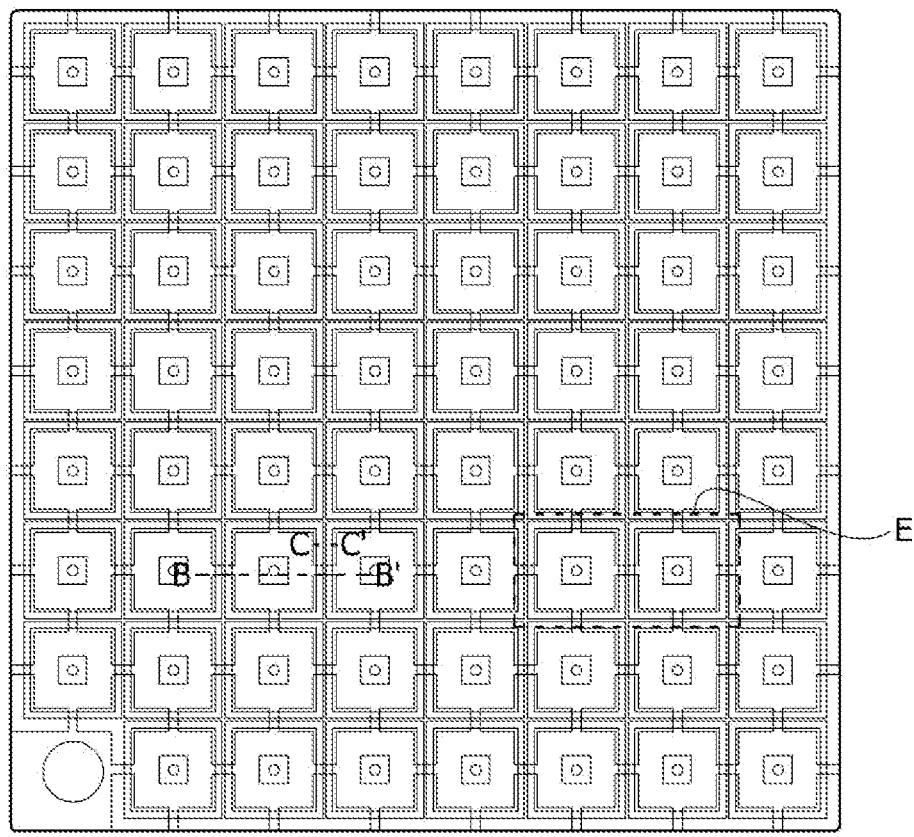

[FIG. 6]
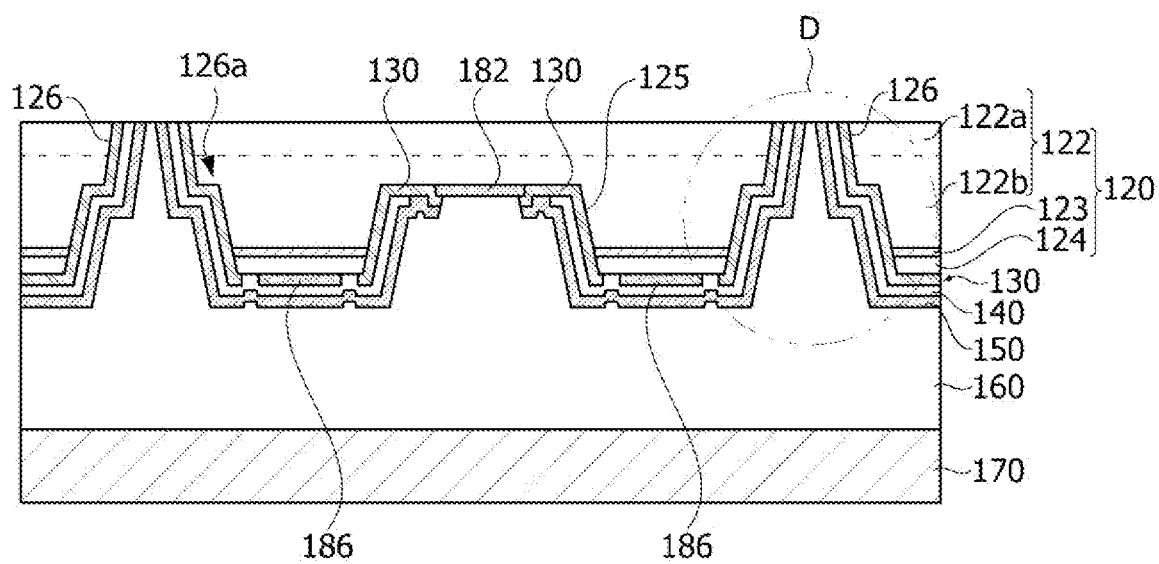

[FIG. 7]
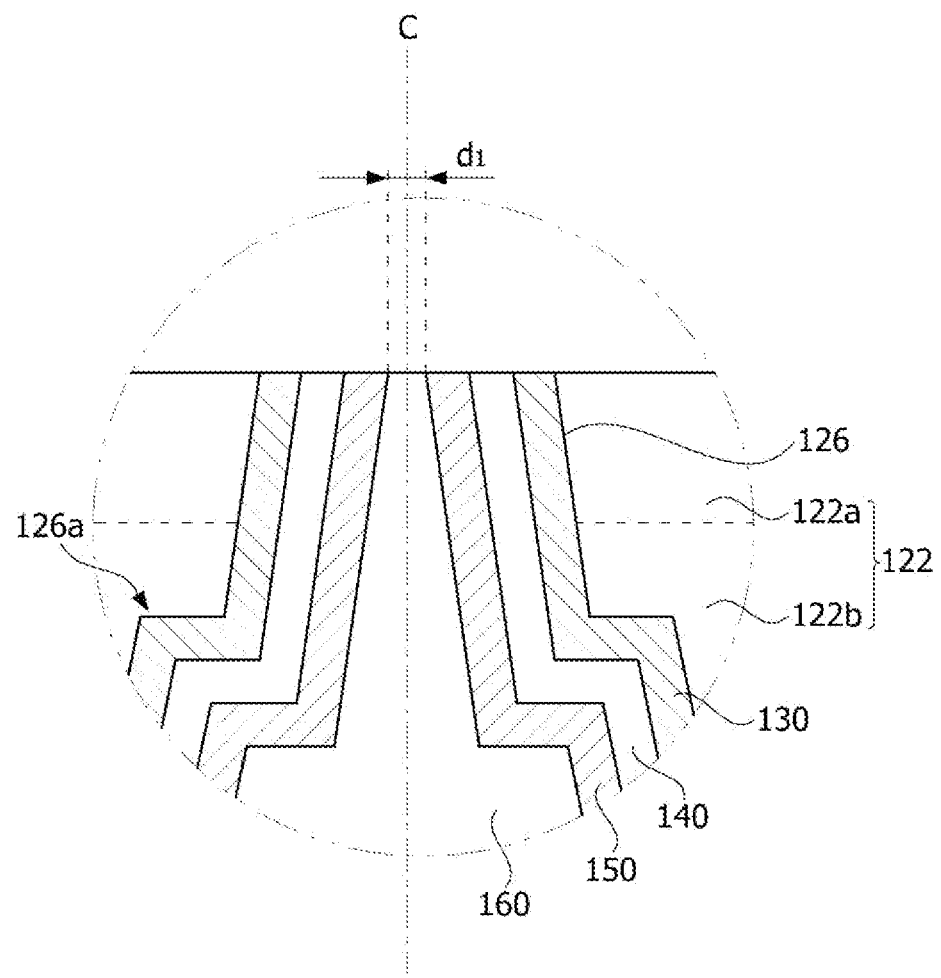

[FIG. 8]
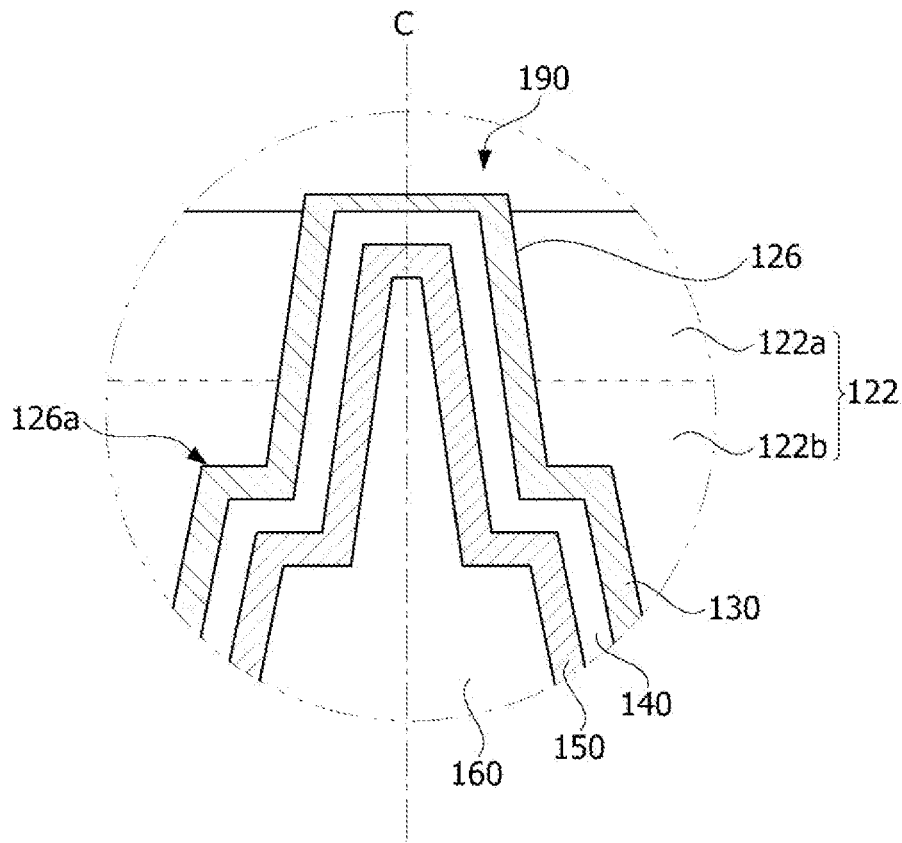
[FIG. 9]
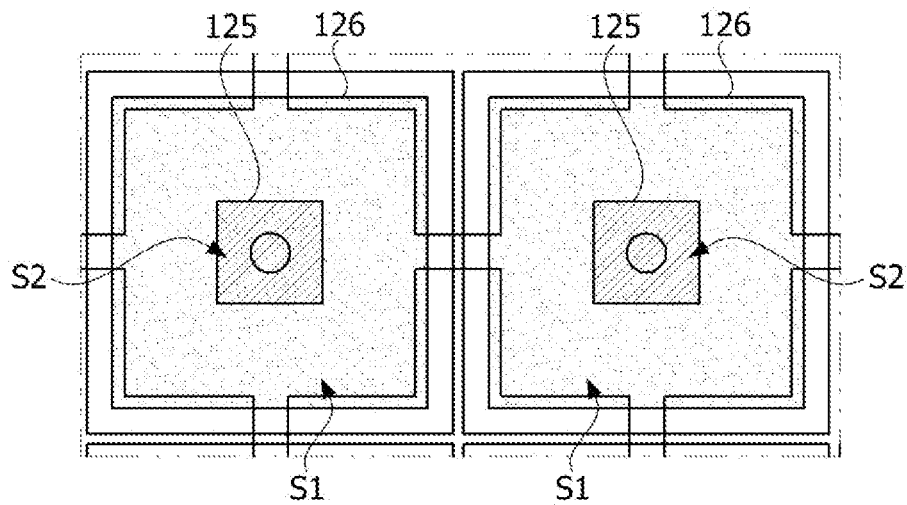

[FIG. 10A]
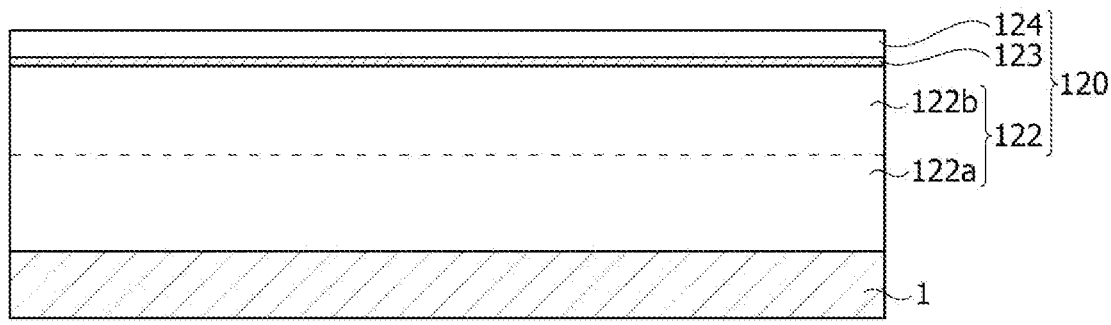
[FIG. 10B]
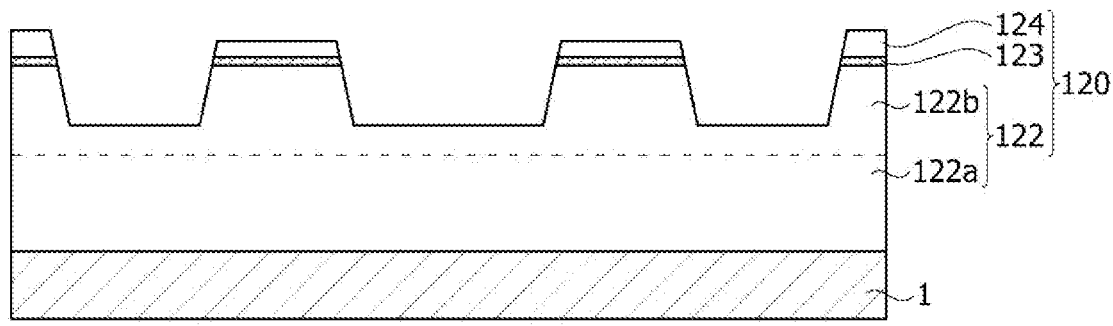
[FIG. 10C]
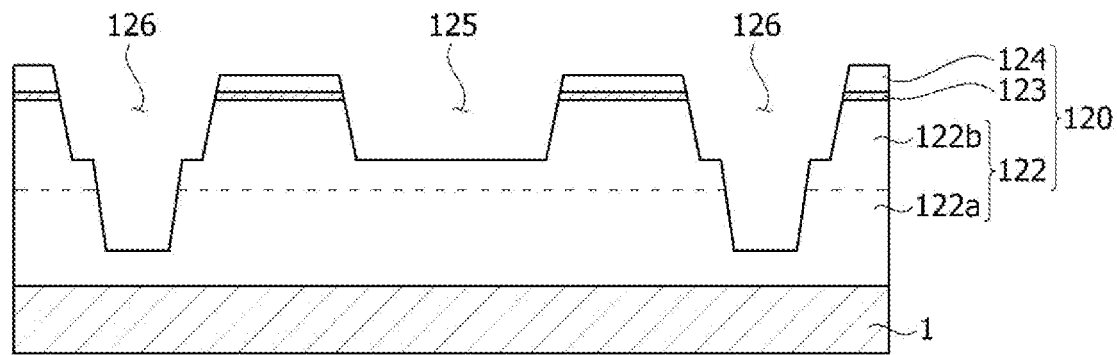

[FIG. 10D]
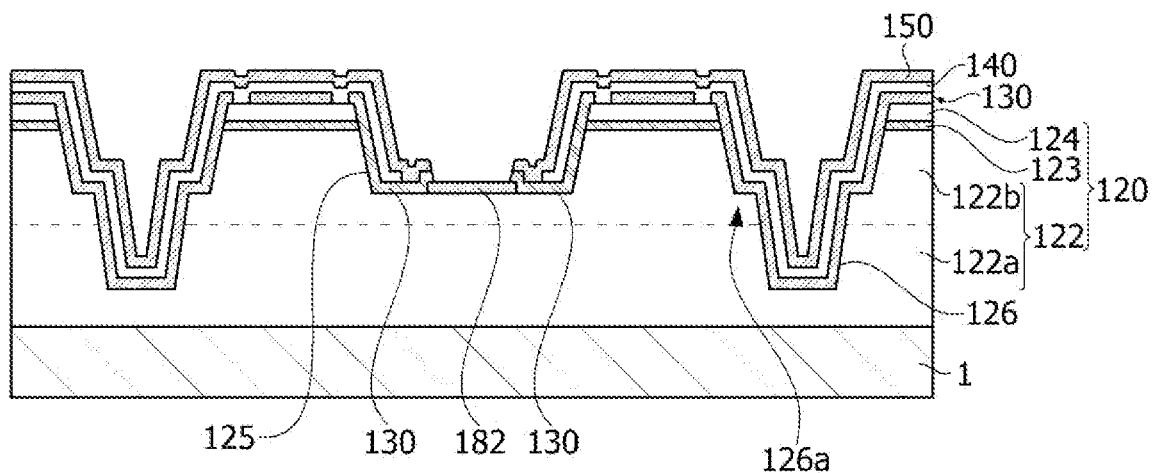
[FIG. 10E]
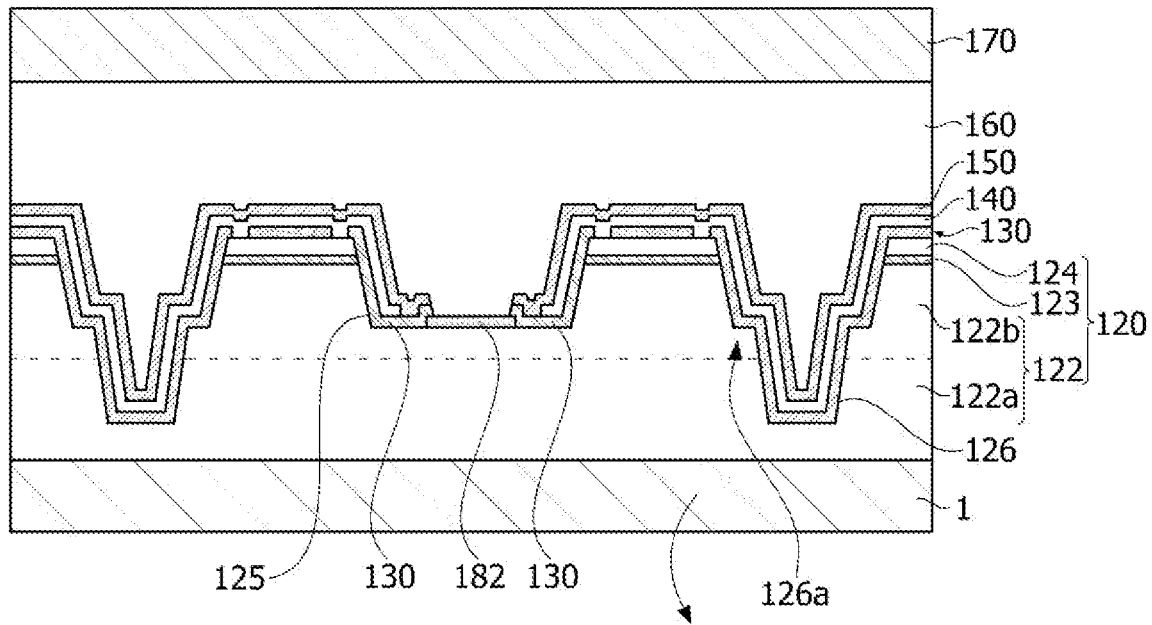

[FIG. 10F]
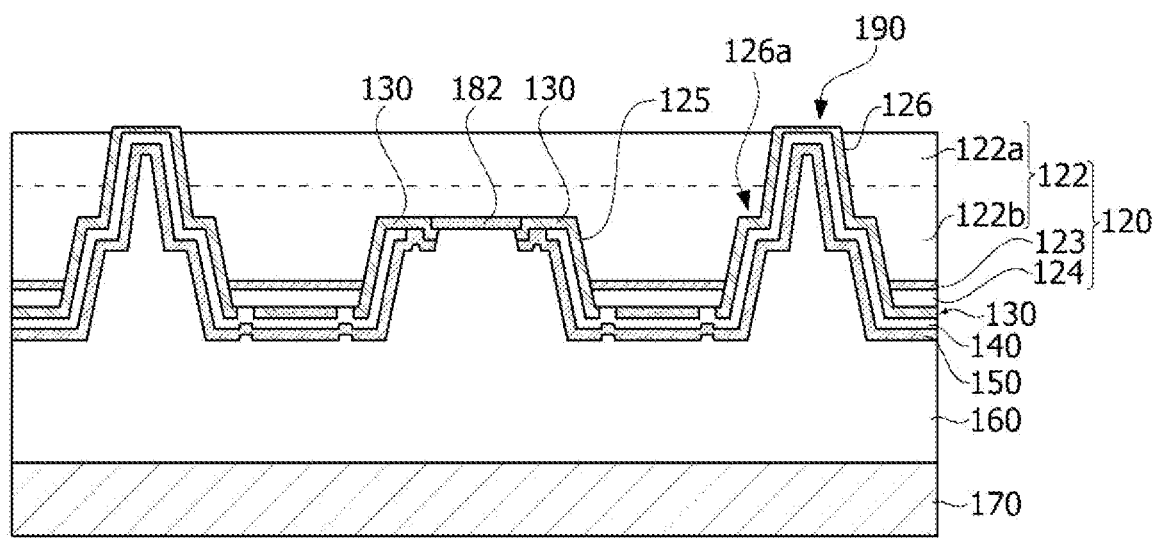
[FIG. 11A]
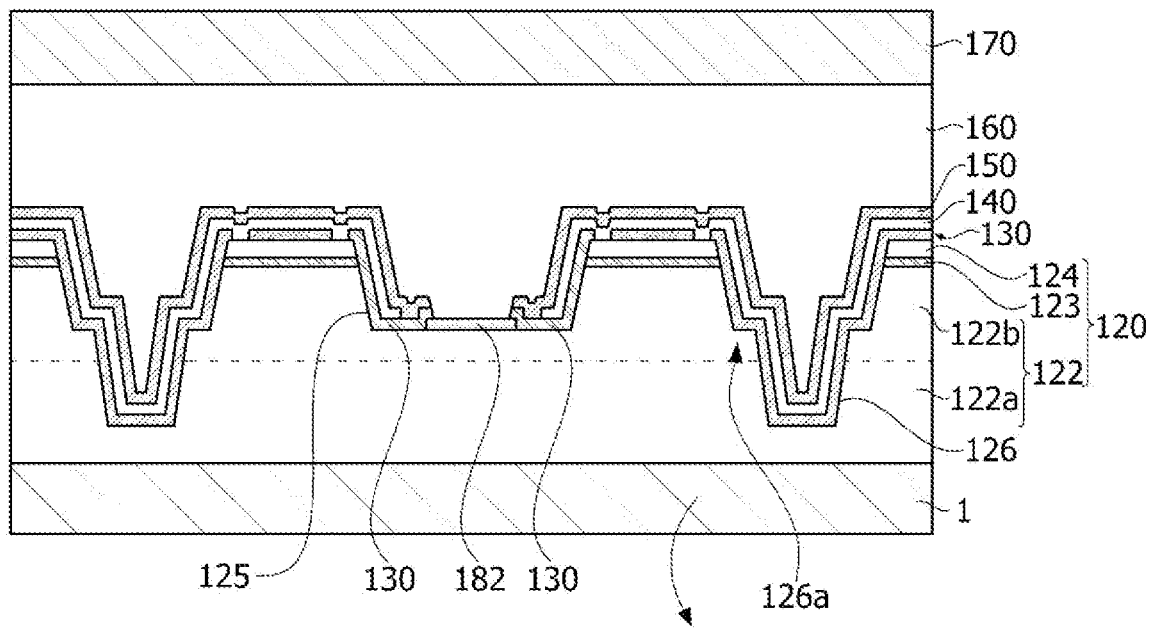

[FIG. 11B]
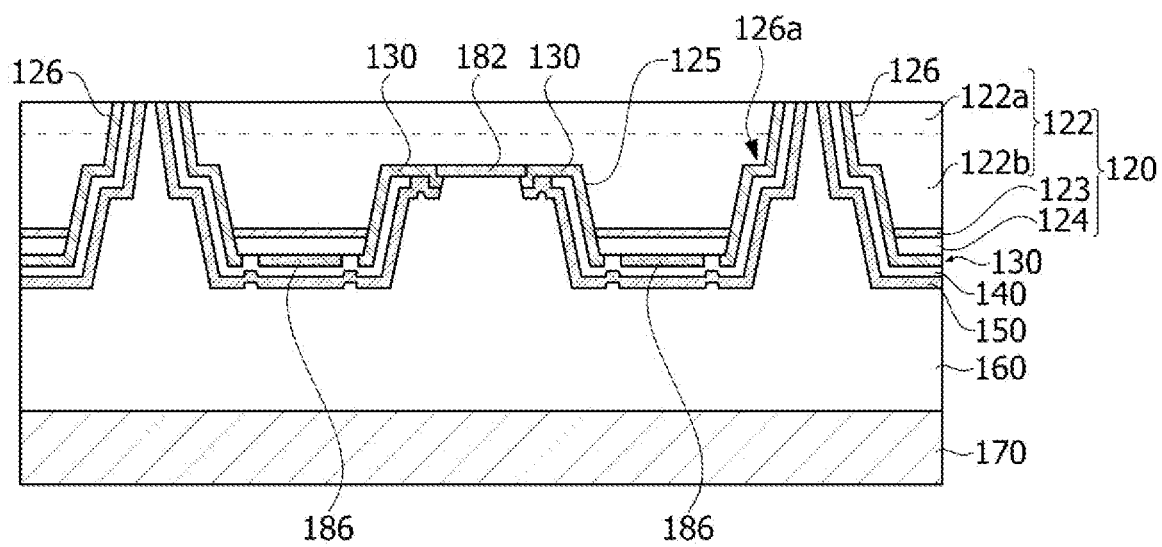

SEMICONDUCTOR ELEMENT

CROSS-REFERENCE TO RELATED PATENT APPLICATIONS

This application is a U.S. National Stage Application under 35 U.S.C. § 371 of PCT Application No. PCT/KR2017/012751, filed Nov. 10, 2017, which claims priority to Korean Patent Application No. 10-2016-0149373, filed Nov. 10, 2016, whose entire disclosures are hereby incorporated by reference.

TECHNICAL FIELD

The present invention relates to a semiconductor device.

BACKGROUND ART

A semiconductor device including a compound, such as GaN and AlGaN, has many advantages, such as wide and adjustable band-gap energy, and thus may be diversely used for light-emitting devices, light-receiving devices, various diodes, and the like.

In particular, a light-emitting device, such as a light-emitting diode or a laser diode, formed of an III-V group or II-VI group compound semiconductor material can realize various colors, such as red, green, and blue, or emit ultraviolet light, due to the development of thin-film growth technology and device materials. The light-emitting device can also emit efficient white light using a fluorescent material or combining colors and has the advantages of low power consumption, semi-permanent lifetime, high response speed, safety, and environmental friendliness as compared to existing light sources such as fluorescent lamps and incandescent lamps.

Moreover, due to the development of device materials, when a light-receiving device, such as a photodetector or a solar cell, is fabricated with an III-V group or II-VI group compound semiconductor material, the light-receiving device generates a photocurrent by absorbing light in various wavelength regions. Therefore, it is possible to use light in various wavelength regions from the gamma-ray region to the radio-wave region. Also, due to the advantages of high response speed, safety, environmental friendliness, and ease of adjusting a device material, the light-receiving device can be readily used in power control or an ultra-high frequency circuit or communication module.

Therefore, the applications of semiconductor devices are being expanded to transmission modules of optical communication means, light-emitting diode backlights which replace cold cathode fluorescence lamps (CCFLs) constituting the backlights of liquid crystal display (LCD) devices, white light-emitting diode illumination devices which may replace fluorescent lamps or incandescent lamps, vehicle headlights, traffic lights, sensors for sensing gas or fire, and the like. Also, the applications of semiconductor devices may be expanded to high-frequency application circuits, power control devices, and communication modules.

In particular, light-emitting devices which emit light in the ultraviolet wavelength region have a curing or sterilization effect and thus can be used for curing, medical treatment, and sterilization.

In the conventional semiconductor device, light emitted from an active layer may travel not only upward but also laterally or downward. In particular, when an Al composition is increased, the amount of light emitted from a side surface may be increased. Therefore, an optical travel path of light emitted from the semiconductor device may be lengthened, or the light may be absorbed in a semiconductor structure.

DISCLOSURE

Technical Problem

The present invention is directed to providing a semiconductor device having improved light extraction efficiency.

The present invention is also directed to providing a semiconductor device having an enhanced optical output and a lowered operating voltage.

The present invention is also directed to providing a flexible semiconductor device.

Technical Solution

One aspect of the present invention provides a semiconductor device including: a plurality of semiconductor structures which include a first conductive semiconductor layer, a second conductive semiconductor layer, an active layer disposed between the first conductive semiconductor layer and the second conductive semiconductor layer, and a first recess passing through the second conductive semiconductor layer and the active layer and extending to a partial region of the first conductive semiconductor layer; a second recess disposed between the plurality of semiconductor structures; a first electrode disposed in the first recess and electrically coupled to the first conductive semiconductor layer; a reflective layer disposed under the second conductive semiconductor layer; and a protrusion part disposed on the second recess and protruding higher than an upper surface of the semiconductor structure. A distance from a surface, on which the first electrode is in contact with the first conductive semiconductor layer in the first recess, to the upper surface of the semiconductor structure is in a range of 300 nm to 500 nm.

A shortest distance between adjacent second conductive semiconductor layers may be greater than or equal to 9 μm and less than or equal to 74 μm.

The reflective layer may have a thickness of 0.5 μm to 1 μm.

The semiconductor device may include a second electrode pad electrically coupled to the reflective layer.

The semiconductor device may further include a second electrode disposed between the second conductive semiconductor layer and the reflective layer.

The reflective layer may be electrically coupled to the second electrode.

The semiconductor device may further include an insulating layer covering the reflective layer and the first recess.

The semiconductor device may further include a bonding layer disposed under the insulating layer, the first recess, and the first electrode.

The semiconductor device may further include a substrate disposed under the bonding layer and electrically coupled to the bonding layer.

One surfaces of the second recess, the reflective layer, the insulating layer, and the bonding layer may be coplanar with the upper surface of the semiconductor structure.

The semiconductor structures may generate light in an ultraviolet wavelength range.

The first conductive semiconductor layer may include a 1st-2 conductive semiconductor layer disposed adjacent to the active layer and a 1st-1 conductive semiconductor layer disposed on the 1st-2 conductive semiconductor layer, the 1st-1 conductive semiconductor layer may have a higher Al content than the 1st-2 conductive semiconductor layer, and the first electrode may be disposed under the 1st-2 conductive semiconductor layer.

The second recess may include a step portion. A distance between an upper surface of the second electrode and the step portion may be equal to a distance between the upper surface of the second electrode and the surface on which the first electrode is in contact with the first conductive semiconductor layer.

An area ratio of a first region partitioned by the second recess to a second region partitioned by the first recess may be in a range of 1:0.1 to 1:0.4.

Another aspect of the present invention provides a semiconductor device including: a plurality of semiconductor structures which include a first conductive semiconductor layer, a second conductive semiconductor layer, an active layer disposed between the first conductive semiconductor layer and the second conductive semiconductor layer, and a first recess passing through the second conductive semiconductor layer and the active layer and extending to a partial region of the first conductive semiconductor layer and which have an upper surface and a lower surface; a second recess disposed between the plurality of semiconductor structures; and a light extraction structure extending from a lower surface of the semiconductor structure to an upper surface of the semiconductor structure and exposed at the upper surface of the semiconductor structure. A distance from a surface, on which the first electrode is in contact with the first conductive semiconductor layer, to the upper surface of the semiconductor structure is in a range of 300 nm to 500 nm.

Still another aspect of the present invention provides an electronic device including the semiconductor device and a case configured to accommodate the semiconductor device.

Advantageous Effects

According to embodiments, light extraction efficiency can be improved.

Also, an optical output can be enhanced.

Further, an operating voltage can be improved.

Moreover, a semiconductor device can be flexible.

Various useful advantages and effects of the present invention are not limited to those mentioned above and will be easily understood from the detailed description of embodiments of the present invention.

DESCRIPTION OF DRAWINGS

FIG. 1 is a plan view of a semiconductor device according to a first embodiment.

FIG. 2 is a cross-sectional view of the semiconductor device taken along line A-A' of FIG. 1 according to the first embodiment.

FIG. 3 is a partial enlarged view of FIG. 1.

FIG. 4A is a cross-sectional view illustrating thicknesses and distances in FIG. 2.

FIGS. 4B to 4E are cross-sectional views of modified examples of the semiconductor device shown in FIG. 4A.

FIG. 5 is a plan view of a semiconductor device according to a second embodiment.

FIG. 6 is a cross-sectional view of the semiconductor device taken along line B-B' of FIG. 5 according to the second embodiment.

FIG. 7 is an enlarged view of D in FIG. 6.

FIG. 8 is an enlarged cross-sectional view of the semiconductor device taken along line C-C' of FIG. 5 according to the second embodiment.

FIG. 9 is an enlarged view of E in FIG. 5.

FIGS. 10A to 10F are views illustrating a method of fabricating a semiconductor device according to the first embodiment of the present invention.

FIGS. 11A and 11B are views illustrating a method of fabricating a semiconductor device according to the second embodiment of the present invention.

MODES OF THE INVENTION

Embodiments of the present invention may be modified into other forms, or several embodiments may be combined with each other. The scope of the present invention is not limited to each of the embodiments described below.

Even when a description of a specific embodiment is not repeated in another embodiment, the description may be understood as pertaining to the other embodiment unless the contrary or something contradictory is stated in another embodiment.

For example, assuming that characteristics of a configuration A are described in a specific embodiment and characteristics of a configuration B are described in another embodiment, even when an embodiment in which the configuration A and the configuration B are combined is not clearly stated, it should be understood that the embodiment belongs to the scope of the present invention unless the contrary or something contradictory is stated.

In describing embodiments, when any one element is stated to be formed "on or under" another element, the two elements may be formed in direct contact with each other or formed in indirect contact with each other, that is, one or more other elements may be formed between the two elements. Also, the term "on or under" may indicate not only an upper direction of one element but also a lower direction of the element.

Hereinafter, embodiments of the present invention will be described in detail with reference to the accompanying drawings so that those of ordinary skill in the art to which the present invention pertains may readily implement the embodiments.

FIG. 1 is a plan view of a semiconductor device according to a first embodiment. FIG. 2 is a cross-sectional view of the semiconductor device taken along line A-A' of FIG. 1 according to the first embodiment. FIG. 3 is a partial enlarged view of FIG. 1.

Referring to FIGS. 1 to 3, the semiconductor device according to the first embodiment of the present invention may include a plurality of semiconductor structures. The number of semiconductor structures may be varied, and accordingly, the semiconductor device may be varied in size.

Referring to FIG. 2, the semiconductor device according to the first embodiment may include a plurality of semiconductor structures 120, a first insulating layer 130, first recesses 125, second recesses 126, a reflective layer 140, a second insulating layer 150, a bonding layer 160, and a substrate 170.

Each of the semiconductor structures 120 may include a first conductive semiconductor layer 122, a second conductive semiconductor layer 124, an active layer 123 disposed between the first conductive semiconductor layer 122 and the second conductive semiconductor layer 124, and a first recess 125 passing through the second conductive semiconductor layer 124 and the active layer 123 and extending to a partial region of the first conductive semiconductor layer 122.

The semiconductor structures 120 according to the embodiment may generate light in an ultraviolet wavelength range.

For example, the semiconductor structures 120 may output light in a near ultraviolet (UV-A) wavelength range, light in a far ultraviolet (UV-B) wavelength range, and light in a deep ultraviolet (UV-C) wavelength range. An ultraviolet wavelength range may be determined by an Al composition ratio of the semiconductor structures 120.

For example, light in a near ultraviolet (UV-A) wavelength range may have a wavelength ranging from 320 nm to 420 nm, light in a far ultraviolet (UV-B) wavelength range may have a wavelength ranging from 280 nm to 320 nm, and light in a deep ultraviolet (UV-C) wavelength range may have a wavelength ranging from 100 nm to 280 nm.

The first conductive semiconductor layer 122 may be disposed in an upper portion of the semiconductor structure 120. The first conductive semiconductor layer 122 may include a 1st-2 conductive semiconductor layer 122b disposed adjacent to the active layer 123 and a 1st-1 conductive semiconductor layer 122a disposed on the 1st-2 conductive semiconductor layer 122b.

An Al composition of the 1st-1 conductive semiconductor layer 122a may differ from that of the 1st-2 conductive semiconductor layer 122b. For example, the 1st-1 conductive semiconductor layer 122a may be a layer with high Al composition, and the 1st-2 conductive semiconductor layer 122b may be a layer with low Al composition. A lower surface of the 1st-1 conductive semiconductor layer 122a may be in contact with and electrically coupled to an upper surface of a first electrode 182.

The first conductive semiconductor layer 122 may be implemented as a semiconductor composed of a chemical compound, such as –V group or –VI group, and may be doped with a first dopant. For example, the first conductive semiconductor layer 122 may be selected from among GaN, AlGaN, InGaN, InAlGaN, and the like which are semiconductor materials having an empirical formula of "$In_{x1}Al_{y1}Ga_{1-x1-y1}N$ ($0 \leq x1 \leq$, $0 \leq y1 \leq 1$, $0 \leq x1+y1 \leq 1$)." The first dopant may be an n-type dopant such as Si, Ge, Sn, and Te. When the first dopant is an n-type dopant, the first conductive semiconductor layer 122 doped with the first dopant may be an n-type semiconductor layer.

An Al composition of the 1st-1 conductive semiconductor layer 122a may be in a range of 55% to 70%, and an Al composition of the 1st-2 conductive semiconductor layer 122b may be in a range of 40% to 55%. The 1st-2 conductive semiconductor layer 122b may be disposed adjacent to the active layer 123.

In this case, when the Al compositions increase, a current-spreading characteristic in the semiconductor structure 120 may be degraded. Also, the amount of light emitted from a side surface of the active layer 113 is increased (a transverse magnetic (TM) mode) as compared to the amount of light emitted from a GaN-based blue light-emitting device. Such a TM mode may be generated from an ultraviolet semiconductor device.

The active layer 123 may be disposed between the first conductive semiconductor layer 122 and the second conductive semiconductor layer 124. In the active layer 123, electrons (or holes) injected through the first conductive semiconductor layer 122 meet holes (or electrons) injected through the second conductive semiconductor layer 124. When electrons and holes recombine, the active layer 123 is transitioned to a low energy level and may generate light of a wavelength corresponding to the energy level.

The active layer 123 may have any one of a single well structure, a multi-well structure, a single quantum well structure, a multi-quantum well (MQW) structure, a quantum dot structure, and a quantum wire structure, but a structure of the active layer 123 is not limited thereto. The active layer 123 may include Al.

The second conductive semiconductor layer 124 may be disposed under the active layer 123. The second conductive semiconductor layer 124 may be electrically coupled to a second electrode 186.

The second conductive semiconductor layer 124 may be implemented as a semiconductor composed of a chemical compound, such as –V group or –VI group. Also, the second conductive semiconductor layer 124 may be doped with a second dopant. The second conductive semiconductor layer 124 may be formed of a semiconductor material having an empirical formula of $In_{x5}Al_{y2}Ga_{1-x5-y2}N$ ($0 \leq x5 \leq 1$, $0 \leq y2 \leq 1$, $0 \leq x5+y2 \leq 1$) or a material selected from among AlInN, AlGaAs, GaP, GaAs, GaAsP, and AlGaInP. When the second dopant is a p-type dopant, such as Mg, Zn, Ca, Sr, and Ba, the second conductive semiconductor layer 124 doped with the second dopant may be a p-type semiconductor layer.

The first recess 125 may pass through the second conductive semiconductor layer 124 and the active layer 123 and extend to a partial region of the first conductive semiconductor layer 122. There may be at least one first recess 125 in the semiconductor structure 120. The first electrode 182 is disposed in the first recess 125 and may be electrically coupled to the first conductive semiconductor layer 122.

The second recesses 126 may be disposed between the plurality of semiconductor structures 120. The second electrode 186 may be disposed between the second recess 126 and the first recess 125. Also, the second electrode 186 may be disposed under the second conductive semiconductor layer 124 and electrically coupled to the second conductive semiconductor layer 124.

Referring to FIG. 3, the semiconductor device may include a plurality of first regions S1 partitioned by the second recesses 126. The first electrode 182 and the second electrode 186 may be disposed in each of the first regions S1. The first regions S1 may have a polygonal shape, such as a hexagonal shape, an octagonal shape, and a quadrangular shape, or a shape with a curvature. However, the shape of the first regions S1 is not limited thereto.

The semiconductor device may include second regions S2 in which the first conductive semiconductor layers are exposed in the first recesses 125. The second regions S2 may have a polygonal shape, such as a hexagonal shape, an octagonal shape, and a quadrangular shape, or a shape with a curvature. However, the shape of the second regions S2 is not limited thereto. The first electrodes 182 may be disposed in the second regions S2. An area ratio of the first region S1 to the second region S2 may be in a range of 1:0.1 to 1:0.4.

When the area ratio of the first region to the second region is less than 1:0.1, an area of the first electrode 182 disposed in the first recess 125 is small, and an operating voltage may be increased, which is problematic.

When the area ratio of the first region to the second region is exceeds 1:0.4, areas of the active layer 123 and the second conductive semiconductor layer are small, and luminous flux emitted from the semiconductor structure may be reduced, which is problematic.

The second recess 126 may include a step portion 126a. A distance between an upper surface of the second electrode 186 and the step portion 126a may be equal to a distance between the upper surface of the second electrode 186 and a surface on which the first electrode 182 is in contact with the first conductive semiconductor layer 122. However, the distance between the upper surface of the second electrode 186 and the step portion 126a is not limited thereto. Also, the second recess 126 may not include the step portion 126a. The second recess 126 may be disposed to pass through the first conductive semiconductor layer 122.

The second recess 126 may include a protrusion part 190 which is disposed at a higher level than an upper surface of the semiconductor structure 120 from a lower surface of the semiconductor structure 120. The reflective layer 140 may be disposed in the second recess 126, and an upper surface of the reflective layer 140 may be disposed at a higher level than the upper surface of the semiconductor structure 120. Unlike this, the upper surface of the reflective layer 140 may be disposed at a lower level than the upper surface of the semiconductor structure 120, and accordingly, the levels of the upper surfaces are not limited to the former case.

A distance from an upper surface of the protrusion part 190 and the supper surface of the reflective layer 140 may be a thickness of the protrusion part 190. The thickness of the protrusion part 190 may become progressively smaller away from the center of an upper surface of the second recess 126 in a first direction. The upper surface of the protrusion part 190 may have a curvature. The first direction may be a direction X1 or X2. A second direction may be a direction Y1 or Y2. The second direction is a stacking direction of the semiconductor structure, and the first direction is a direction perpendicular to the second direction.

The protrusion part 190 may uniformize luminous flux emitted from the overall semiconductor device by adjusting a beam angle of light emitted between the semiconductor structures 120. When the protrusion part 190 has a curvature, the protrusion part 190 may serve as a lens, and it is possible to control the beam angle of light emitted between the semiconductor structures 120 by adjusting the thickness and shape of the protrusion part 190. Therefore, it is possible to control the uniformity of luminous flux emitted from the semiconductor device by adjusting the thickness and shape of the protrusion part 190.

The protrusion part 190 may include the reflective layer 140 and/or the first insulating layer 130.

The first insulating layer 130 disposed in the protrusion part 190 may have a smaller thickness than the first insulating layer 130 disposed at a lower surface of the second conductive semiconductor layer 124. In this case, the thickness of the protrusion part 190 may be a distance in the direction Y2 between an upper surface of the first conductive semiconductor layer 122 and the upper surface of the protrusion part 190. The protrusion part 190 may protect the upper surface of the reflective layer 140 against external moisture or pollutants by preventing the upper surface of the reflective layer 140 disposed in the second recess 126 from being externally exposed.

The thickness of the protrusion part 190 may be in a range of 0.05 μm to 0.7 μm to improve the uniformity of luminous flux emitted from the semiconductor device. When the thickness of the protrusion part 190 is less than 0.05 μm, a characteristic that the upper surface of the reflective layer 140 disposed in the second recess 126 protects the upper surface of the reflective layer 140 from external moisture or pollutants may be degraded. When the thickness of the protrusion part 190 exceeds 0.7 μm, a flexible characteristic of the semiconductor device may be degraded.

The first insulating layer 130 may extend from a lower portion of the semiconductor structure 120 into the first recess 125 and the second recess 126. The first insulating layer 130 may electrically separate the first conductive semiconductor layer 122 from the second conductive semiconductor layer 124.

The first insulating layer 130 may have a thickness of 0.1 μm to 0.7 μm, but the thickness is not limited thereto. When the thickness of the first insulating layer 130 is 0.1 μm or less, electrical reliability may be degraded. On the other hand, when the thickness of the first insulating layer 130 is 0.7 μm or more, delamination may occur or cracks may be generated in the reflective layer 140 due to a difference in the coefficient of thermal expansion (CTE) between the reflective layer 140 and the first insulating layer 130 or thermal stress between the reflective layer 140 and the first insulating layer 130 such that electrical reliability of the semiconductor device may be degraded or light extraction efficiency may be degraded.

The first insulating layer 130 may be formed of at least one of silicon oxide (SiOx), silicon nitride (SixNy), and aluminum oxide (AlxOy) but is not limited thereto.

The first insulating layer 130 may include a material having a lower refractive index than the semiconductor structure 120. When the protrusion part 190 is formed of the same material as that of the first insulating layer 130, a refractive index of the protrusion part 190 is lower than a refractive index of the semiconductor structure 120 due to such a configuration, and accordingly, the light extraction efficiency of the semiconductor device may be improved.

The reflective layer 140 may be disposed under the first insulating layer 130 and the second conductive semiconductor layer 124. The reflective layer 140 may be electrically coupled to the second conductive semiconductor layer 124. Also, the reflective layer 140 may cover the second electrode 186 and may be electrically coupled to the second electrode 186.

The reflective layer 140 may extend from the lower surface of the second conductive semiconductor layer 124 to a partial region of the first recess 125. Also, the reflective layer 140 may extend from the lower surface of the second conductive semiconductor layer 124 into the second recess 126.

The reflective layer 140 may be disposed on the lower surface of the second conductive semiconductor layer 124 and reflect light emitted from the active layer 123 above the semiconductor structure 120.

Also, the reflective layer 140 may extend into the first recess 125 and the second recess 126 and reflect light emitted from the active layer 123 above the semiconductor structure 120. Therefore, the reflective layer 140 may increase luminous flux emitted from the semiconductor device and control a beam angle of the semiconductor device.

When the reflective layer 140 extends to a partial region of the first recess 125, the reflective layer 140 may be disposed not to be in direct contact with the first electrode 182 and the bonding layer 160 disposed in the first recess 125. Therefore, it is possible to reflect light emitted from a side surface and an upper surface of the first recess 125 above the semiconductor structure 120.

When the reflective layer 140 is in direct contact with the first electrode 182 and the bonding layer 160, the first electrode 182 and the second electrode 186 may be short-circuited. Also, the first electrode 182 may be short-circuited with the bonding layer 160. For this reason, a current is not injected into the semiconductor structure 120 such that the semiconductor device may malfunction.

Therefore, the reflective layer 140 may be disposed up to a partial region of the upper surface of the first recess 125. The shortest separation distance between the reflective layer 140 and the first electrode 182 may be in a range of 1 µm to 15 µm. When the distance between the reflective layer 140 and the first electrode 182 is less than 1 µm, there is a lack of a process margin for ensuring the distance between the reflective layer 140 and the first electrode 182 such that a yield of the semiconductor device may be reduced. When there is no separation distance between the reflective layer 140 and the first electrode 182, the first electrode 182 and the reflective layer 140 are electrically coupled to each other such that the semiconductor device may malfunction.

Also, when the semiconductor device operates for a long time, the first electrode 182 and the reflective layer 140 may be short-circuited due to atom migration of the reflective layer 140. When the distance between the reflective layer 140 and the first electrode 182 exceeds 15 µm, an area of the upper surface of the first recess 125 is increased. Therefore, an area of the active layer 123 in the semiconductor structure 120 is reduced such that luminous flux emitted from the semiconductor structure 120 and the semiconductor device may be reduced.

The reflective layer 140 may be electrically coupled to a second electrode pad 146. Power supplied from the second electrode pad 146 may be provided to the second conductive semiconductor layer 124 through the reflective layer 140 and the second electrode 186. The reflective layer 140 may have a thickness of 0.03 µm to 1 µm. Preferably, the thickness of the reflective layer 140 is in a range of 0.8 µm to 1 µm.

As the reflective layer 140, a material having high reflectance in an ultraviolet wavelength range may be selected. The reflective layer 140 may include a conductive material. For example, the reflective layer 140 may include Al.

The second insulating layer 150 may be disposed under the reflective layer 140 and the first recess 125. The second insulating layer 150 may electrically insulate the bonding layer 160 from the reflective layer 140. Also, the second insulating layer 150 may electrically insulate the substrate 170 from the reflective layer 140. The second insulating layer 150 may have a thickness of 0.5 µm to 1 µm, but the thickness is not limited thereto.

When the thickness of the second insulating layer 150 is less than 0.5 µm, electrical reliability of the semiconductor device may be degraded. When the thickness of the second insulating layer 150 is greater than or equal to 1 µm, reliability of the semiconductor device is degraded by pressure or thermal stress applied to the device during a process, and the light extraction efficiency is degraded.

The bonding layer 160 may be disposed under the second insulating layer 150 or the first electrode 182. The bonding layer 160 may be electrically coupled to the first electrode 182. The second insulating layer 150 may be disposed between the bonding layer 160 and the reflective layer 140. The second insulating layer 150 may be disposed to electrically separate the reflective layer 140 from the bonding layer 160. The bonding layer 160 may bond the semiconductor structure 120 and the substrate 170 disposed under the semiconductor structure 120 together.

The bonding layer 160 may include a conductive material. For example, the bonding layer 160 may include a material selected from the group consisting of gold (Au), tin (Sn), indium (In), aluminum (Al), silicon (Si), silver (Ag), nickel (Ni), and copper (Cu) or an alloy thereof.

The substrate 170 may be disposed under the bonding layer 160. The substrate 170 may be formed of a conductive material such as a metal. The substrate 170 may be electrically coupled to the bonding layer 160. For example, the substrate 170 may include a metal or semiconductor material. The substrate 170 may be a metal with excellent electrical conductivity and/or thermal conductivity. In this case, it is possible to rapidly transfer heat generated during operation of the semiconductor device to the outside.

The substrate 170 may include a material selected from the group consisting of Si, molybdenum (Mo), tungsten (W), Cu, and Al or an alloy thereof. However, the substrate 170 is not limited thereto.

The first electrode 182 may be disposed in the first recess 125. The first electrode 182 may be disposed to be in contact with a lower surface of the 1st-2 conductive semiconductor layer 122b. Due to this configuration, the semiconductor device may secure a relatively smooth current injection characteristic. Due to a high Al composition, the 1st-1 conductive semiconductor layer 122a may have an inferior current-spreading characteristic and current injection characteristic as compared to the 1st-2 conductive semiconductor layer 122b. Therefore, the first electrode 182 may be disposed on the lower surface of the 1 st-2 conductive semiconductor layer 122b.

The first electrode 182 may be electrically coupled to the first conductive semiconductor layer 122. The first electrode 182 may have a thickness of 0.2 µm to 0.3 µm. However, the thickness of the first electrode 182 is not limited thereto.

The thickness of the first electrode 182 may be smaller than that of the first insulating layer 130. The first insulating layer 130 and the first electrode 182 may be disposed apart from each other. The shortest separation distance between the first insulating layer 130 and the first electrode 182 may be in a range of 0.3 µm to 0.5 µm. When the shortest separation distance is less than 0.3 µm, a distance for disposing the second insulating layer 140 which is disposed at a shortest separation distance is too short, and accordingly, it may be difficult to dispose the second insulating layer 150. For this reason, cracks may be generated or delamination may occur in the second insulating layer 150. The reliability of the semiconductor device may be degraded.

When the shortest separation distance exceeds 0.5 µm, an area of the first recess 125 becomes too large, and an area of the active layer 123 of the semiconductor structure 120 is reduced. Therefore, luminous flux emitted from the semiconductor structure 120 may be reduced. The thickness of the first electrode 182 may be in a range of 40% to 80% of the thickness of the first insulating layer 130.

When the thickness of the first electrode 182 is less than 40% of the thickness of the first insulating layer 130, problems such as delamination and cracks may occur due to degradation of a step coverage characteristic which is caused by disposing a lower electrode.

When the thickness of the first electrode 182 exceeds 80% of the thickness of the first insulating layer 130, the second insulating layer 150 may be disposed within the separation distance between the first insulating layer 130 and the first electrode 182. In this case, a gap-fill characteristic of the second insulating layer 150 is degraded such that cracks may be generated or delamination may occur in the second insulating layer 150.

The second electrode 186 may be disposed between the second conductive semiconductor layer 124 and the reflective layer 140. The second electrode 186 may be electrically coupled to the reflective layer 140. Also, the second electrode 186 may be electrically coupled to the second electrode pad 146 through the reflective layer 140.

A distance between the second electrode pad 146 and the semiconductor structure 120 may be in a range of 5 μm to 30 μm. When the distance is less than 5 μm, it is difficult to ensure a process margin. When the distance is greater than 30 μm, an area in which the second electrode pad 146 is disposed increases in the entire device. Therefore, the area of the active layer 123 may be reduced, and the amount of light may be reduced.

A height of a convex portion of the second electrode pad 146 may be larger than that of the active layer 123. Therefore, the second electrode pad 146 may improve the light extraction efficiency by reflecting light emitted in a horizontal direction of the device from the active layer 123 and control a beam angle.

The first electrode 182 and the second electrode 186 may be formed to include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), ZnO, IrOx, RuOx, NiO, RuOx/ITO, Ni/IrOx/Au or Ni/IrOx/Au/ITO, Ag, Ni, Cr, Ti, Al, Rh, Pd, Ir, Sn, In, Ru, Mg, Zn, Pt, Au, and Hf but are not limited to these materials.

The second electrode pad 146 may be formed of a conductive material. The second electrode pad 146 may have a single layer or multi-layer structure and include Ti, Ni, Ag, and Au. For example, the second electrode pad 146 may have a structure of Ti/Ni/Ti/Ni/Ti/Au.

The center of the second electrode pad 146 is recessed such that an upper surface thereof may have a concave portion and a convex portion. A wire (not shown) may be bonded to the concave portion of the upper surface. Therefore, the wire may be further firmly bonded to the second electrode pad 146 due to a large adhesive area.

The second electrode pad 146 may reflect light. Therefore, when the second electrode pad 146 is closer to the semiconductor structure 120, the light extraction efficiency may be improved.

Prominences and depressions may be formed on the upper surface of the semiconductor structure 120. These prominences and depressions may improve the extraction efficiency of light emitted from the semiconductor structure 120. The prominences and depressions may have an average height varying according to an ultraviolet wavelength. The prominences and depressions may have a height of about 300 nm to about 800 nm in the case of UV-C, and the light extraction efficiency may be improved when the average height is about 500 nm to about 600 nm.

FIG. 4A is a cross-sectional view illustrating thicknesses and distances in FIG. 2, and FIGS. 4B to 4E are cross-sectional views of modified examples of the semiconductor device shown in FIG. 4A.

Referring to FIG. 4A, in the first recess 125, a first distance h1 from a surface on which the first electrode 182 is in contact with the 1st-2 conductive semiconductor layer 122b to the upper surface of the semiconductor structure 120 may be in a range of 300 nm to 500 nm.

The first distance h1 may be the shortest distance from the upper surface of the first recess 125 to the upper surface of the semiconductor structure 120.

A surface on which the first electrode 182 is in contact with the first conductive semiconductor layer 122 may be coplanar with an interface between the 1st-1 conductive semiconductor layer 122a and the 1st-2 conductive semiconductor layer 122b but is not limited thereto.

When the first distance h1 is less than 300 nm, the first conductive semiconductor layer 122 is reduced in thickness such that current spreading may be degraded. This may cause a reduction in luminous flux of the semiconductor device.

When the first distance h1 is greater than 500 nm, multiple rays of light may be confined in the first conductive semiconductor layer 122. This may lower the light intensity of the semiconductor device.

A second distance h2 between a lower portion of the second conductive semiconductor layer 124 and the upper surface of the first recess 125 may be in a range of 0.7 μm to 1 μm.

When the second distance h2 is less than 0.7 μm, the thickness of the first conductive semiconductor layer 122 is so small that a current-spreading characteristic may be degraded. As a result, the uniformity of a current injected into the semiconductor structure 120 may be degraded. Also, a current or heat is concentrated on the vicinity of the first recess 125 such that electrical and optical characteristics and reliability of the semiconductor device may be degraded.

On the other hand, when the second distance h2 is greater than 1 μm, a path of light emitted from the active layer 123 lengthens in the semiconductor structure 120, and the amount of light absorbed in the semiconductor structure 120 is increased, such that the luminous flux of the semiconductor device may be reduced.

A first angle θ1 between the lower surface of the semiconductor structure 120 and the second recess 126 extending from the lower surface of the semiconductor structure 120 may be in a range of 90° to 120°. When the first angle θ1 between the second recess 126 and the lower surface of the semiconductor structure 120 exceeds 120°, a width of the upper surface of the second recess 126 is so small that a gap-fill characteristic may be degraded in the process of forming the reflective layer 140. Voids or cracks may be generated between the upper surface of the reflective layer 140 and a lower surface of the protrusion part 190, and accordingly, reliability and light extraction efficiency of the semiconductor device may be degraded.

The second recess 126 may include the step portion 126a. A height h3 from the step portion 126a to the lower surface of the semiconductor structure 120 may be equal to the height h2 from the upper surface of the first recess 125 to the lower surface of the semiconductor structure 120.

When a semiconductor process is applied, the first recess 125 and the second recess 126 may be formed by dry etching or wet etching. When the second recess 126 which passes through the semiconductor structure 120 is formed through a semiconductor process, the second recess 126 may be formed through several stages of processes because of a large thickness of the semiconductor structure 120. Therefore, when the height h3 from the step portion 126a to the lower surface of the semiconductor structure 120 is equal to the height h2 from the upper surface of the first recess 125 to the semiconductor structure 120, it is possible to reduce the number of processes by disposing the first recess 125 and the second recess 126 through a plurality of etching processes. Also, it is possible to reduce a yield and production costs of the semiconductor device.

A width L5 of the step portion 126a may be in a range of 0.5 μm to 3 μm. Step portions 126a may be symmetrically formed with respect to the center of the second recess 126, which is disposed between adjacent semiconductor structures 120, in the first direction.

However, the step portions 126a are not limited thereto and may be formed on only one side on the basis of the center of the second recess 126 in the first direction. FIG. 4A shows that identical step portions 126a are disposed in the directions X1 and X2 on the basis of the first direction of the second recess 126, but, for example, the step portions 126a disposed in the directions X1 and X2 may have different widths.

Also, light emitted from the active layer 123 may be scattered at the step portion 126a in the semiconductor structure 120. Accordingly, a probability of total internal reflection which occurs in the semiconductor structure 120 may be lowered, and the light extraction efficiency of the semiconductor device may be improved.

The first angle θ1 may be in a range of 90° to 120°. The first angle θ1 may be an angle between the lower surface of the semiconductor structure 120 and the second recess 126 extending from the lower surface of the semiconductor structure 120. However, the first angle θ1 is not limited thereto.

A second angle θ2 may be in a range of 90° to 120°. The second angle θ2 may be an angle between the step portion 126a included in the second recess 126 and a side surface of the first conductive semiconductor layer 122 which extends from the step portion 126a to the second recess 126 and is in contact with the upper surface of the semiconductor structure 120.

When the second angle θ2 exceeds 120°, a width of the upper surface of the second recess 126 is so small that a gap-fill characteristic may be degraded in the process of disposing the reflective layer 140. Therefore, voids or cracks may be generated between the upper surface of the reflective layer 140 and the lower surface of the protrusion part 190, and accordingly, the reliability and light extraction efficiency of the semiconductor device may be degraded.

The first angle θ1 and the second angle θ2 may be identical to or different from each other. A beam angle of the semiconductor structure 120 may be controlled by adjusting the first angle θ1 and the second angle θ2 to be identical to or different from each other.

When an Al composition in the 1st-1 conductive semiconductor layer 122a is increased, a current-spreading effect may be reduced. Therefore, a current is distributed only in the vicinity of the first electrode 182, and a current density may be drastically reduced at a location far away from the center of the first electrode 182. Consequently, an effective light-emitting region may be reduced in size.

A low current density region which is far from the center of the first electrode 182 has a low current density and, accordingly, may barely contribute to light emission. Therefore, according to the embodiment, the reflective layer 140 may be formed in a region having a low current density such that the light extraction efficiency may be improved.

However, it is inefficient to form the reflective layer 140 in the entire area of the low current density region. Therefore, it may be advantageous to leave only a region in which the reflective layer 140 will be formed and densely dispose the first electrodes 182 in a remaining region so as to enhance an optical output.

A shortest length L1 of the lower surface of the second conductive semiconductor layer 124 disposed between the first recess 125 and the second recess 126 may be in a range of 10 μm to 35 μm.

A shortest distance L3 from a step portion 126a formed in a 2nd-1 recess 126 to a step portion 126a formed in an adjacent 2nd-2 recess 126 may be in a range of 45 μm to 100 μm.

A shortest distance L2 from the center of the upper surface of the exposed 2nd-1 recess 126 to the center of the upper surface of the adjacent 2nd-2 recess 126 may be in a range of 50 μm to 110 μm.

A shortest distance L4 between pieces of the second conductive semiconductor layer 124 disposed in the first region may be in a range of 9 μm to 74 μm.

The second recess 126 may be disposed to pass through the first conductive semiconductor layer 122. A distance from the upper surface of the first conductive semiconductor layer 122 to the lower surface of the semiconductor structure 120 may be smaller than a distance from an upper surface of the first insulating layer 130 disposed in the second recess 126 to the lower surface of the semiconductor structure 120. In this case, the upper surface of the protrusion part 190 may be disposed at a higher level than the upper surface of the semiconductor structure 120. Also, the upper surface of the semiconductor structure 120 may be disposed between the upper surface of the protrusion part 190 and the upper surface of the reflective layer 140.

Unlike this, referring to FIG. 4B, the upper surface of the protrusion part 190 may have a curvature as described above. According to such a configuration, the uniformity of luminous flux emitted from the semiconductor device may be improved.

Referring to FIG. 4C, the upper surface of the semiconductor structure 120 may be coplanar with the upper surface of the first insulating layer 130 disposed in the second recess 126. Unlike this, referring to FIG. 4D, the upper surface of the semiconductor structure 120 may be disposed between the upper surface of the first insulating layer 130 disposed in the second recess 126 and the upper surface of the reflective layer 140 disposed in the second recess 126 according to the degree of etching.

Referring to FIG. 4E, the upper surface of the semiconductor structure 120 may be disposed between the upper surface of the reflective layer 140 disposed in the second recess 126 and an upper surface of the second insulating layer 150 disposed in the second recess 126. The upper surface of the semiconductor structure 120 may be disposed in various positions according to the degree of etching.

FIG. 5 is a plan view of a semiconductor device according to a second embodiment, FIG. 6 is a cross-sectional view of the semiconductor device taken along line B-B' of FIG. 5 according to the second embodiment, FIG. 7 is an enlarged view of D in FIG. 6, FIG. 8 is an enlarged cross-sectional view of the semiconductor device taken along line C-C' of FIG. 5 according to the second embodiment, and FIG. 9 is an enlarged view of E in FIG. 5.

Referring to FIGS. 5 to 9, the semiconductor device according to the second embodiment of the present invention may include semiconductor structures 120, a first insulating layer 130, second recesses 126, a reflective layer 140, a second insulating layer 150, a bonding layer 160, and a substrate 170.

The semiconductor device according to the second embodiment may include the plurality of semiconductor structures 120. The number of semiconductor structures 120 may vary, and the semiconductor device may vary in size accordingly. However, the semiconductor device is not limited thereto.

Each of the semiconductor structures may include a first conductive semiconductor layer 122, a second conductive semiconductor layer 124, an active layer 123 disposed between the first conductive semiconductor layer 122 and the second conductive semiconductor layer 124, and a first recess 125 passing through the second conductive semiconductor layer 124 and the active layer 123 and extending to a partial region of the first conductive semiconductor layer 122.

The first conductive semiconductor layer 122 may be disposed in an upper portion of the semiconductor structure 120. The first conductive semiconductor layer 122 may include a 1st-2 conductive semiconductor layer 122b disposed adjacent to the active layer 123 and a 1st-1 conductive semiconductor layer 122a disposed on the 1st-2 conductive semiconductor layer 122b.

An Al composition of the 1st-1 conductive semiconductor layer 122a may differ from that of the 1st-2 conductive semiconductor layer 122b. For example, the 1st-1 conductive semiconductor layer 122a may be a layer with high Al composition, and the 1st-2 conductive semiconductor layer 122b may be a layer with low Al composition. A lower surface of the 1 st-1 conductive semiconductor layer 122a may be in contact with and electrically coupled to an upper surface of a first electrode 182.

The active layer 123 may be disposed between the first conductive semiconductor layer 122 and the second conductive semiconductor layer 124. In the active layer 123, electrons (or holes) injected through the first conductive semiconductor layer 122 meet holes (or electrons) injected through the second conductive semiconductor layer 124. When electrons and holes recombine, the active layer 123 is transitioned to a low energy level and may generate light of a wavelength corresponding to the energy level.

The second conductive semiconductor layer 124 may be disposed under the active layer 123. The second conductive semiconductor layer 124 may be electrically coupled to a second electrode 186.

The first recess 125 may pass through the second conductive semiconductor layer 124 and the active layer 123 and extend to a partial region of the first conductive semiconductor layer 122. There may be at least one first recess 125 in the semiconductor structure. The first electrode 182 is disposed in the first recess 125 and may be electrically coupled to the first conductive semiconductor layer 122.

The second recesses 126 may be disposed between the plurality of semiconductor structures 120. The second electrode 186 may be disposed between the second recess 126 and the first recess 125.

The second recess 126 may include a step portion 126a. A distance between an upper surface of the second electrode 186 and the step portion 126a may be equal to a distance between the upper surface of the second electrode 186 and a surface on which the first electrode 182 is in contact with the first conductive semiconductor layer 122.

However, the distances are not limited to this case. Also, the second recess 126 may not include the step portion 126a. The second recess 126 may be disposed to pass through the first conductive semiconductor layer 122.

The second recess 126 may be exposed through the first conductive semiconductor layer 122. The second recess 126 and the reflective layer 140 may be partially exposed in the same plane as an upper surface of the semiconductor structure 120. However, the present invention not limited to this case, and the upper surface of the semiconductor structure 120 may be upper or lower than the exposed surfaces of the second recess 126 and the reflective layer 140. Also, the second insulating layer 150 and the bonding layer 160 may also be partially exposed. The upper surfaces exposed by the second recess 126, the reflective layer 140, the second insulating layer 150, and the bonding layer 160 may be coplanar.

The exposed surfaces may include interfaces between the plurality of semiconductor structures 120. When the semiconductor device is bent or folded, the second recess 126 and the second insulating layer 150 may be easily damaged by stress at the center of an interface. In this case, a foreign material, humidity, or the like may be introduced such that the semiconductor device may malfunction.

Also, when the reflective layer 140 is broken, electrical coupling between pieces of the second electrode 186 may be blocked such that a plurality of arrayed semiconductor devices may be turned off. Therefore, the second recess 126 which is vulnerable to external stress may not cover a surface, at which the second recess 126 is exposed, of the reflective layer 140. Such a configuration may prevent the second insulating layer 150 from being damaged by stress applied to an upper portion of the reflective layer 140.

The first insulating layer 130 may extend from a lower portion of the semiconductor structure 120 into the first recess 125 and the second recess 126. The first insulating layer 130 may electrically separate the first conductive semiconductor layer 122 from the second conductive semiconductor layer 124. The first insulating layer 130 may have a thickness of 0.1 µm to 0.7 µm, but the thickness is not limited thereto. The reflective layer 140 may be disposed under the first insulating layer 130 and the second conductive semiconductor layer 124.

The reflective layer 140 may be electrically coupled to the second conductive semiconductor layer 124. The reflective layer 140 may cover the second electrode 186 and may be electrically coupled to the second electrode 186. Also, the reflective layer 140 may extend from a lower surface of the second conductive semiconductor layer 124 to a partial region of the first recess 125 and extend from the lower surface of the second conductive semiconductor layer 124 into the second recess 126.

When the reflective layer 140 extends to a partial region of the first recess 125, the reflective layer 140 may be disposed not to be in direct contact with the first electrode 182 and the bonding layer 160 disposed in the first recess 125. Therefore, it is possible to reflect light emitted to a side surface and a partial upper surface of the first recess 125 above the semiconductor structure 120.

When the reflective layer 140 is in direct contact with the first electrode 182 and the bonding layer 160, the first electrode 182 and the second electrode 186 may be short-circuited. For this reason, a current is not injected into the semiconductor structure 120 such that the semiconductor device may malfunction.

Therefore, the reflective layer 140, which extends to a partial region of an upper surface of the first recess 125, may have a separation distance of 1 µm to 15 µm from the first electrode 182. When the distance between the reflective layer 140 and the first electrode 182 is less than 1 µm, there is a lack of a process margin for ensuring the distance between the reflective layer 140 and the first electrode 182 such that a yield of the semiconductor device may be reduced. Also, when the semiconductor device operates for a long time, the first electrode 182 and the reflective layer 140 may be short-circuited with each other due to atom migration of the reflective layer 140.

When the distance between the reflective layer 140 and the first electrode 182 exceeds 15 µm, an area of the upper surface of the first recess 125 is increased. Therefore, an area of the active layer 123 in the semiconductor structure 120 is reduced such that luminous flux emitted from the semiconductor structure 120 and the semiconductor device may be reduced.

The second insulating layer 150 may be disposed under the reflective layer 140 and the first recess 125. The second insulating layer 150 may electrically insulate the bonding layer 160 and the substrate 170 from the reflective layer 140. The second insulating layer 150 may have a thickness of 0.8 µm to 1 µm, but the thickness is not limited thereto.

The bonding layer 160 may be disposed under the second insulating layer 150. Also, the bonding layer 160 may be disposed on a lower surface of the second insulating layer 150 and under the first electrode 182 and electrically coupled to the first electrode 182. The second insulating layer 150 may be disposed between the bonding layer 160 and the reflective layer 140.

The second insulating layer 150 may be disposed to electrically separate the reflective layer 140 and the bonding layer 160 from each other. The bonding layer 160 may bond the semiconductor structure 120 and the substrate 170 disposed under the semiconductor structure 120 together.

The substrate 170 may be disposed under the bonding layer 160. The substrate 170 may be formed of a conductive material, such as a metal. The substrate 170 may be electrically coupled to the bonding layer 160. For example, the substrate 170 may include a metal or semiconductor material. The substrate 170 may be a metal with excellent electrical conductivity and/or thermal conductivity. In this case, it is possible to rapidly transfer heat generated during operation of the semiconductor device to the outside.

The substrate 170 may include a material selected from the group consisting of Si, Mo, Si, W, Cu, and Al or an alloy thereof. However, the substrate 170 is not limited thereto.

The first electrode 182 may be disposed in the first recess 125. Also, the first electrode 182 may be disposed on the 1st-2 conductive semiconductor layer 122b. Due to this configuration, the semiconductor device may secure a relatively smooth current injection characteristic.

Due to a high Al composition, the 1st-1 conductive semiconductor layer 122a may have an inferior current-spreading characteristic and current injection characteristic as compared to the 1st-2 conductive semiconductor layer 122b. Therefore, the first electrode 182 may be disposed on a lower surface of the 1 st-2 conductive semiconductor layer 122b.

The second electrode 186 may be disposed between the second conductive semiconductor layer 124 and the reflective layer 140. The second electrode 186 may be electrically coupled to the reflective layer 140.

Referring to FIG. 7, parts of the second recess 126, the reflective layer 140, the second insulating layer 150, and the bonding layer 160 may be exposed at the same surface as an upper surface of the first conductive semiconductor layer 122. The substrate 170 may include a center C of the exposed surface. The center C is a center point at which the exposed upper surface of the substrate 170 is divided into two parts in the first direction.

Adjacent semiconductor devices may be divided on the basis of the center C. Also, the semiconductor device may be bent or folded on the basis of the center C. The second recess 126 and the second insulating layer 150 may be divided on the basis of the center. Neither the second recess 126 nor the second insulating layer 150 may exist at the center C. According to such a configuration, the semiconductor device may be little stressed by folding or bending. For this reason, the semiconductor device according to the embodiment can be readily used in a flexible device.

A width dl in which the bonding layer 160 is exposed may be in a range of 5 µm to 11 µm. The semiconductor device may have a width of 5 µm or more from an adjacent semiconductor device on the basis of the center C in order to have a flexible effect.

Referring to FIG. 8, a part of the upper surface of the semiconductor device may be exposed. Due to such a configuration, the reflective layer 140 of the semiconductor device may be separated from the partial region.

FIGS. 10A to 10F are views illustrating a method of fabricating the semiconductor device according to the first embodiment of the present invention.

Referring to FIGS. 10A to 10F, the method may include an operation of forming a semiconductor structure on a growth substrate 1, an operation of forming a first recess and a second recess by removing a partial region of the semiconductor structure, an operation of forming a first electrode in the first recess and forming a second electrode and a first insulating layer on a second conductive semiconductor layer, an operation of forming a reflective layer on the first insulating layer, an operation of forming a second insulating layer on the reflective layer, an operation of forming a bonding layer on the second insulating layer, and an operation of disposing a substrate 170 on the bonding layer. Subsequently, the method may include an operation of separating the growth substrate 1 and etching a first conductive semiconductor layer to a certain thickness range.

Referring to FIG. 10A, the first conductive semiconductor layer 122, the active layer 123, and the second conductive semiconductor layer 124 may be sequentially disposed on the growth substrate 1 to fabricate the semiconductor structure 120.

The first conductive semiconductor layer 122 may be formed to include the 1st-1 conductive semiconductor layer 122a in contact with the growth substrate 1 and the 1st-2 conductive semiconductor layer 122b disposed on the 1st-1 conductive semiconductor layer 122a. The 1st-1 conductive semiconductor layer 122a may have a higher Al composition than the 1st-2 conductive semiconductor layer 122b.

A buffer layer (not shown) may be further provided between the first conductive semiconductor layer and the substrate 170. The buffer layer (not shown) may mitigate lattice mismatch between the substrate 170 and the first conductive semiconductor layer 122, the active layer 123, and the second conductive semiconductor layer 124. The buffer layer may be a combination of group elements or may include any one of GaN, InN, AlN, InGaN, AlGaN, InAlGaN, and AlInN. The buffer layer may be doped with a dopant but is not limited thereto.

The first conductive semiconductor layer 122, the active layer 123, and the second conductive semiconductor layer 124 may be formed using a method of metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), sputtering, or the like, but the method of forming the layers is not limited thereto.

Referring to FIG. 10B, parts of the second conductive semiconductor layer 124, the active layer 123, and the first conductive semiconductor layer 122 may be removed by first etching. The etching may be performed down to a part of the first conductive semiconductor layer 122. The second conductive semiconductor layer 124, the active layer 123, and the first conductive semiconductor layer 122 may be exposed by the etching.

Referring to FIG. 10C, a part of the first conductive semiconductor layer 122 may be removed down to an upper surface of the 1st-1 conductive semiconductor layer 122a by second etching. The second etching may be performed down to a part of the 1st-1 conductive semiconductor layer 122a. For this reason, the growth substrate 1 is not exposed. The second etching may expose the 1st-1 conductive semiconductor layer 122a down to a partial lower region thereof. The first conductive semiconductor layer 122, the active layer 123, and the second conductive semiconductor layer 124 may be exposed by the first etching and second etching. The semiconductor structure 120 may be a structure having undergone manufacturing execution system application (MESA) etching two times.

Referring to FIG. 10D, the first insulating layer 130 may be disposed on the first conductive semiconductor layer 122, the active layer 123, and the second conductive semiconductor layer 124. The first electrode 182 may be deposited on a surface which is in contact with the 1st-2 conductive semiconductor layer 122b. The second electrode 186 may be deposited on the second conductive semiconductor layer 124.

Also, the first electrode 182 and the second electrode 186 may be formed of an opaque metal, such as Ag, Ni, Al, Rh, Pd, Ir, Ru, Mg, Zn, Pt, Au, and Hf. In this case, a light-emitting area is reduced as much as the area of the first electrode 182, and thus the first electrode 182 may be formed in a small size.

Any generally-used electrode fabrication method, such as sputtering, coating, and deposition, may be used to form the first electrode 182 and the second electrode 186. When the first electrode 182 and the second electrode 186 are formed, a reflective layer and an ohmic layer may be additionally formed.

The first recess 125 may be formed between the first electrode 182 and the second electrode 186, and the second recess 126 may be formed between exposed upper surfaces of the second conductive semiconductor layer 124 in the 1st-1 conductive semiconductor layer 122a exposed by the second etching.

The first electrode 182 and the second electrode 186 may be ohmic electrodes. The first electrode 182 and the second electrode 186 may be formed to include at least one of ITO, IZO, IZTO, IAZO, IGZO, IGTO, AZO, ATO, GZO, IZON, AGZO, ZnO, IrOx, RuOx, NiO, RuOx/ITO, Ni/IrOx/Au or Ni/IrOx/Au/ITO, Ag, Ni, Cr, Ti, Al, Rh, Pd, Ir, Sn, In, Ru, Mg, Zn, Pt, Au, and Hf but are not limited to these materials.

The reflective layer 140 may be formed on the second recess 126 and the second electrode 186. However, the reflective layer 140 may be electrically separated from the first electrode 182. The reflective layer 140 may be disposed under the second electrode 186 and electrically coupled to the second electrode 186.

The second insulating layer 150 may be disposed under the reflective layer 140 and the first recess 125. Due to such a configuration, the reflective layer 140 and the first electrode 182 may be electrically insulated from each other.

Referring to FIG. 10E, the bonding layer 160 may be disposed under the second insulating layer 150. The bonding layer 160 may be disposed under the second insulating layer 150 and the first electrode 182 and electrically coupled to the first electrode 182.

The substrate 170 may be formed on an upper surface of the bonding layer 160. Then, the growth substrate 1 may be removed. A method of removing the growth substrate 1 is not specifically limited. For example, the growth substrate 1 may be removed by a laser lift-off (LLO) process, but the method is not limited thereto.

The bonding layer 160 may bond the substrate 170 disposed under the semiconductor structure 120 and the semiconductor structure 120 together.

Referring to FIG. 10F, the arrangement of the upper surface of the first insulating layer 130 and the upper surface of the semiconductor structure 120 may be in various relationships according to etching. First, the first insulating layer 130 and the upper surface of the semiconductor structure 120 may be coplanar.

Also, the first insulating layer 130 may include the protrusion part 190, which is disposed at a higher level than the upper surface of the semiconductor structure 120 from the lower surface of the semiconductor structure 120, by etching. In other words, the upper surface of the semiconductor structure 120 may be interposed between the upper surface of the protrusion part 190 and the upper surface of the reflective layer 140.

Further, the upper surface of the semiconductor structure 120 and the upper surface of the reflective layer 140 may become coplanar by etching and thus constitute a planar surface. Moreover, the upper surface of the semiconductor structure 120 may be disposed at a lower level than the upper surface of the reflective layer 140 by etching.

FIGS. 11A and 11B are views illustrating a method of fabricating a semiconductor device according to the second embodiment of the present invention.

Since FIG. 11A is the same as FIG. 10E, the method of fabricating a semiconductor device according to the second embodiment of the present invention is the same as described above with reference to up to FIG. 10E.

Referring to FIG. 11B, etching may be performed down to the upper surface of the bonding layer 160. The 1st-1 conductive semiconductor layer 122a may be etched using the same manner as that for the upper surface of the bonding layer 160. Accordingly, parts of the bonding layer 160, the second insulating layer 150, the reflective layer 140, and the second recess 126 may be exposed.

A semiconductor device may be configured as a package and used for curing a resin, a resist, a spin-on-dielectric (SOD), or a spin-on-glass (SOG). Alternatively, the semiconductor device may be used for medical treatment or health care or used for sterilization in an air purifier, a water purifier, or the like.

The semiconductor device may be used as a light source of an illumination system, a light source of an image display device, or a light source of an illumination device. In other words, the semiconductor device may be disposed in a case and applied to various electronic devices which provide light. For example, when the semiconductor device and a red-green-blue (RGB) fluorescent material are used in combination, it is possible to implement white light with a high color rendering index (CRI).

The above-described semiconductor device may constitute a light-emitting device package and may be used as a light source of an illumination system. For example, the semiconductor device may be used as a light source of an image display device or a light source of an illumination device or the like.

When the semiconductor device is used as a backlight unit of an image display device, the semiconductor device may be used as an edge-type backlight unit or a direct-type backlight unit. When the semiconductor device is used as a light source of an illumination device, the semiconductor device may be used as a light fixture or a bulb-type light source. Also, the semiconductor device may be used as a light source of a mobile terminal.

The light-emitting device may be a laser diode in addition to the above-described light-emitting diode.

Like the light-emitting diode, the laser diode may include a first conductive semiconductor layer, an active layer, and a second conductive semiconductor layer of the above-described structure. The laser diode uses an electro-luminescence phenomenon in which light is emitted when a current flows after the bonding of a p-type first conductive semiconductor and an n-type second conductive semiconductor, but the laser diode has differences in terms of the direction and phase of emitted light. In other words, the laser diode may emit light having one specific wavelength (monochromatic beam) in the same phase and same direction using a stimulated emission phenomenon, a reinforcing interference phenomenon, and the like. Due to such characteristics, the laser diode may be used for optical communication or medical equipment, semiconductor process equipment, and the like.

An example of a light-receiving device may be a photodetector, which is a transducer for detecting light and converting the intensity of the light into an electrical signal. The light-receiving device may be a photocell (silicon or selenium), a photoconductive device (cadmium sulfide or cadmium selenide), a photodiode (e.g., a photodiode (PD) having a peak wavelength in a visible blind spectral region or a true blind spectral region), a phototransistor, a photomultiplier tube, a phototube (vacuum or gas sealing), an infra-red (IR) detector, etc., but the embodiment is not limited thereto.

In general, a semiconductor device such as a photodetector may be fabricated using a direct bandgap semiconductor which has high photo conversion efficiency. Alternatively, there are various structures of photodetectors, of which the most general includes pin-type photodetectors using a p-n junction, Schottky-type photodetectors using a Schottky junction, metal semiconductor metal (MSM)-type photodetectors, and the like.

Like a light-emitting device, a photodiode may include a first conductive semiconductor layer, an active layer, and a second conductive semiconductor layer of the above-described structure and is configured in a p-n junction or pin structure. The photodiode is operated by applying a reverse bias or zero bias. When light is incident on the photodiode, electrons and holes are generated and a current flows. In this case, the current may be almost proportional to the intensity of light incident on the photodiode.

A photocell or a solar cell is a type of photodiode and may convert light into a current. Like a light-emitting device, a solar cell may include a first conductive semiconductor layer, an active layer, and a second conductive semiconductor layer of the above-described structure.

Also, the semiconductor device may be used as a rectifier of an electronic circuit through the rectifying characteristics of a general diode that uses a p-n junction and may be applied to a very high frequency circuit and then applied to an oscillation circuit or the like.

In addition, the above-described semiconductor device is not implemented with only a semiconductor and may further include a metal material in some cases. For example, a semiconductor device such as a light-receiving device may be implemented with at least one of Ag, Al, Au, In, Ga, N, Zn, Se, P, and As and may be implemented with a semiconductor material doped with a p-type or n-type dopant or an intrinsic semiconductor material.

Although the embodiments are mainly described above, they are only examples and do not limit the present invention. Those of ordinary skill in the art to which the present invention pertains should appreciate that several variations and applications not presented above can be made without departing from the essential characteristics of the embodiments. For example, each element specifically represented in the embodiments may be implemented in a modified manner. It should be construed that differences related to such a variation and application are included in the scope of the present invention defined in the following claims.

The invention claimed is:

1. A semiconductor device comprising:
a plurality of semiconductor structures which include a first conductive semiconductor layer, a second conductive semiconductor layer, and an active layer disposed between the first conductive semiconductor layer and the second conductive semiconductor layer;
an insulating layer disposed along a bottom of the plurality of semiconductor structures and disposed between the plurality of semiconductor structures;
a first electrode electrically coupled to the first conductive semiconductor layer; and
a reflective layer disposed under the second conductive semiconductor layer, wherein the insulating layer comprises a protrusion part disposed above the semiconductor structure, and
wherein upper surfaces of the plurality of semiconductor structures is spaced apart from each other,
wherein an upper surface of the reflective layer is disposed above an upper surface of the semiconductor structure.

2. The semiconductor device of claim 1, wherein the plurality of semiconductor structures include a first recess passing through the second conductive semiconductor layer and the active layer and extending to a partial region of the first conductive semiconductor layer, and
further comprising a second recess disposed between the plurality of semiconductor structures.

3. The semiconductor device of claim 2, further comprising a second electrode disposed between the second conductive semiconductor layer and the reflective layer,
wherein the second recess includes a step portion, and
a distance between an upper surface of a second electrode and the step portion is equal to a distance between the upper surface of the second electrode and the surface on which the first electrode is in contact with the first conductive semiconductor layer.

4. The semiconductor device of claim 3, wherein the second electrode is disposed between the second recess and the first recess.

5. The semiconductor device of claim 1, wherein the reflective layer has a thickness of 0.5 μm to 1 μm, and
wherein a shortest distance between adjacent second conductive semiconductor layers is greater than or equal to 9 μm and less than or equal to 74 μm.

6. The semiconductor device of claim 1, further comprising a second electrode disposed between the second conductive semiconductor layer and the reflective layer,
wherein the reflective layer is electrically coupled to the second electrode.

7. The semiconductor device of claim 2, further comprising:
a bonding layer disposed under the insulating layer, the first recess, and the first electrode; and
a substrate disposed under the bonding layer and electrically coupled to the bonding layer,
wherein the insulating layer covers the reflective layer and the first recess.

8. The semiconductor device of claim 7, wherein one surfaces of the second recess, the reflective layer, the insulating layer, and the bonding layer are coplanar with the upper surface of the semiconductor structure.

9. The semiconductor device of claim 7, wherein a thickness of the reflective layer disposed below the protrusion part is smaller than a thickness of the insulating layer.

10. The semiconductor device of claim 2, wherein a thickness of the protrusion part decreases from a center of an upper surface of the second recess to an outer periphery of the second recess.

11. The semiconductor device of claim 2, wherein a distance from a surface, on which the first electrode is in contact with the first conductive semiconductor layer in the first recess, to the upper surface of the semiconductor structure is in a range of 300 nm to 500 nm.

12. The semiconductor device of claim 1, wherein the first conductive semiconductor layer comprises:
- a $1^{st}$-2 conductive semiconductor layer disposed adjacent to the active layer; and
- a $1^{st}$-1 conductive semiconductor layer disposed on the $1^{st}$-2 conductive semiconductor layer, wherein the $1^{st}$-1 conductive semiconductor layer has a higher Al content than the $1^{st}$-2 conductive semiconductor layer, and the first electrode is disposed under the $1^{st}$-2 conductive semiconductor layer.

13. The semiconductor device of claim 1, wherein the reflective layer is electrically connected to the second conductive semiconductor layer.

14. The semiconductor device of claim 1, wherein a thickness ratio of the insulating layer and the first electrode is in a range of 1:0.4 to 1:0.8.

15. The semiconductor device of claim 1, further comprising an electrode pad electrically connected to the reflective layer.

16. The semiconductor device of claim 15, wherein a distance between the electrode pad and the semiconductor structure is in a range of 5 μm to 30 μm.

17. The semiconductor device of claim 15, wherein an upper surface of the electrode pad is disposed above the active layer.

18. The semiconductor device of claim 15, wherein the electrode pad has a concave portion and a convex portion.

* * * * *